United States Patent
Lee et al.

(10) Patent No.: US 12,176,425 B2
(45) Date of Patent: Dec. 24, 2024

(54) SEMICONDUCTOR DEVICE AND FORMING METHOD THEREOF

(71) Applicant: TAIWAN SEMICONDUCTOR MANUFACTURING COMPANY, LTD., Hsinchu (TW)

(72) Inventors: Hsin-Yi Lee, Hsinchu (TW); Cheng-Lung Hung, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/315,204

(22) Filed: May 10, 2023

(65) Prior Publication Data

US 2023/0275143 A1 Aug. 31, 2023

Related U.S. Application Data

(63) Continuation of application No. 17/140,308, filed on Jan. 4, 2021, now Pat. No. 11,688,797.

(51) Int. Cl.
*H01L 29/66* (2006.01)
*H01L 21/8234* (2006.01)
*H01L 29/06* (2006.01)
*H01L 29/78* (2006.01)

(52) U.S. Cl.
CPC .. *H01L 29/6681* (2013.01); *H01L 21/823431* (2013.01); *H01L 29/0669* (2013.01); *H01L 29/66545* (2013.01); *H01L 29/7851* (2013.01)

(58) Field of Classification Search
CPC ............ H01L 29/6681; H01L 29/0669; H01L 29/66545; H01L 29/7851; H01L 21/823431
See application file for complete search history.

(56) References Cited

U.S. PATENT DOCUMENTS

| | | | |
|---|---|---|---|
| 9,935,173 B1 * | 4/2018 | Wu | H01L 21/823437 |
| 10,510,620 B1 * | 12/2019 | Chanemougame | H01L 27/0924 |
| 2018/0090326 A1 | 3/2018 | Jagannathan et al. | |
| 2018/0374926 A1 * | 12/2018 | Lee | H01L 21/823842 |
| 2019/0067122 A1 | 2/2019 | Cheng et al. | |
| 2020/0373206 A1 * | 11/2020 | Cheng | H01L 21/32133 |
| 2021/0134671 A1 | 5/2021 | Xie et al. | |
| 2022/0093596 A1 | 3/2022 | Lavric et al. | |

\* cited by examiner

*Primary Examiner* — Christine A Enad
(74) *Attorney, Agent, or Firm* — Birch, Stewart, Kolasch & Birch, LLP

(57) ABSTRACT

A method of forming a semiconductor device including forming a fin structure having a stack of alternating first semiconductor layers and second semiconductor layers over a substrate, the first semiconductor layers and the second semiconductor layers having different compositions, forming a dummy gate structure across the fin structure, forming gate spacers on opposite sidewalls of the dummy gate structure, respectively, removing the dummy gate structure to form a gate trench between the gate spacers, etching the first semiconductor layers in the gate trench, such that the second semiconductor layers are suspended in the gate trench to serve as nanosheets, forming a work function metal layer surrounding each of the nanosheets, and depositing a fill metal layer over the work function metal layer without using a fluorine-containing precursor.

20 Claims, 28 Drawing Sheets

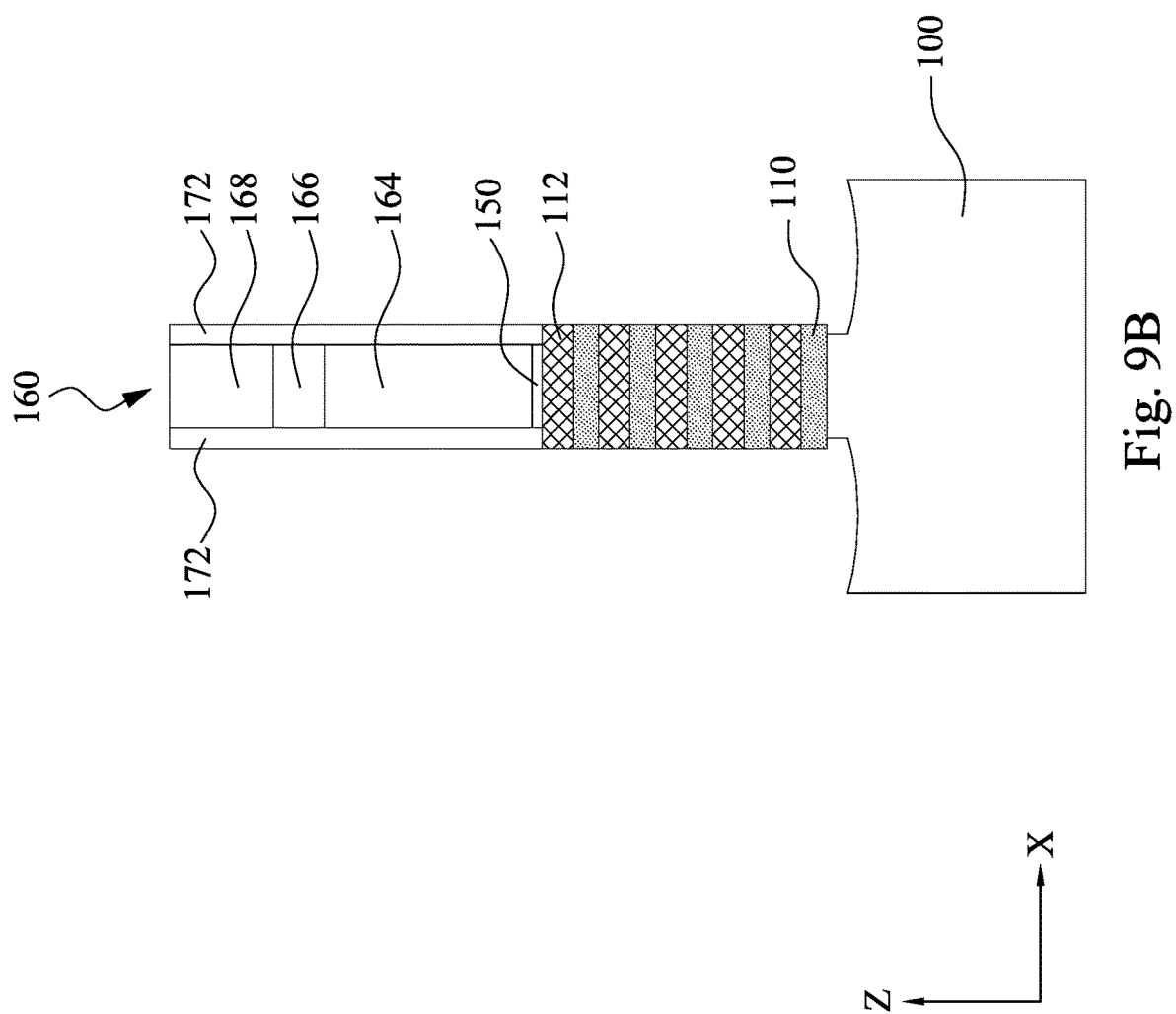

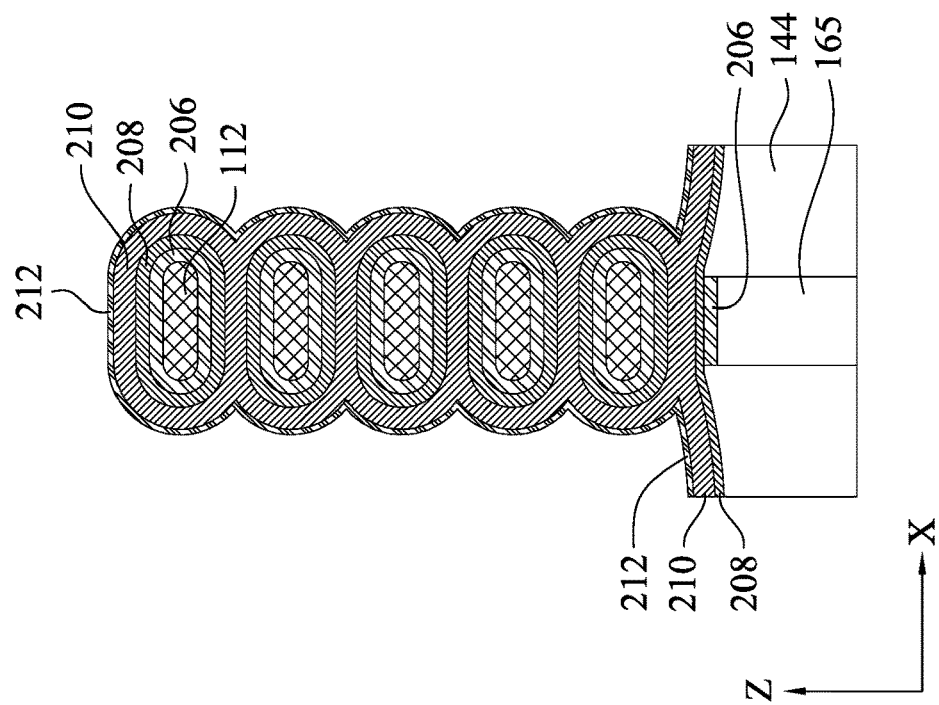
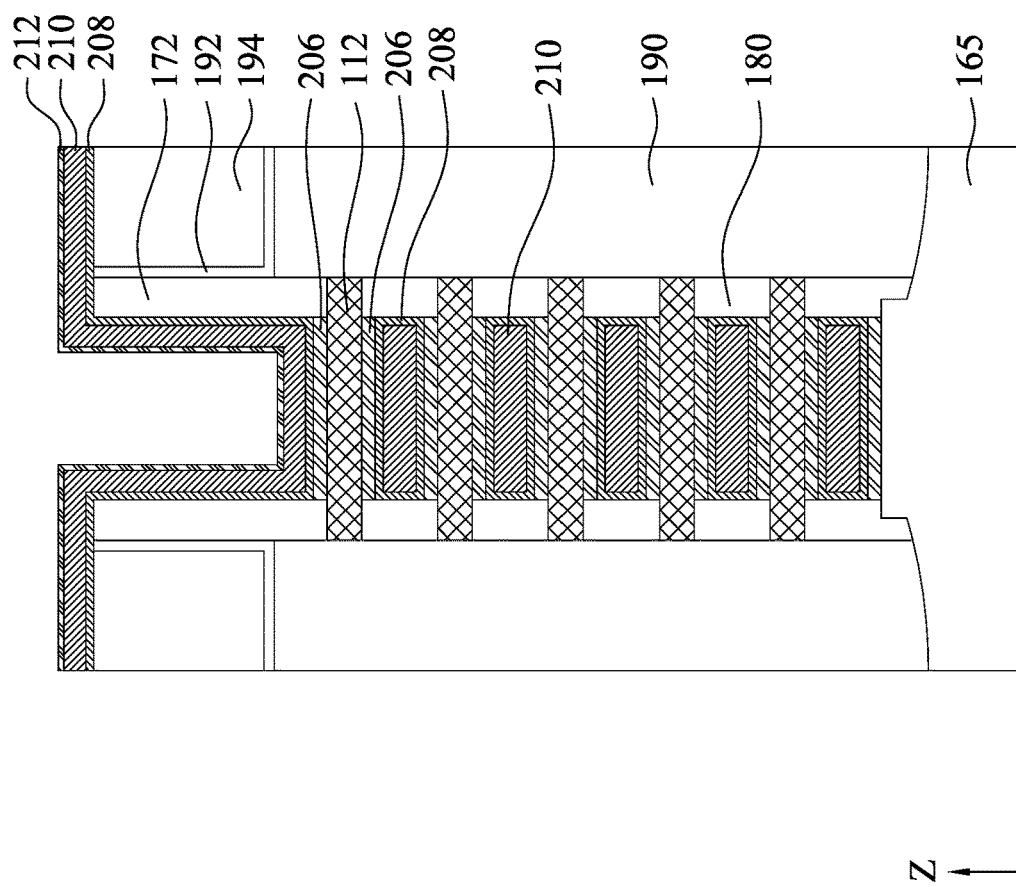
Fig. 20B
Fig. 20A

SEMICONDUCTOR DEVICE AND FORMING METHOD THEREOF

CROSS-REFERENCE TO RELATED APPLICATION

This application is continuation application of U.S. application Ser. No. 17/140,308, filed Jan. 4, 2021, which is herein incorporated by reference in its entirety.

BACKGROUND

Transistors are components of modern integrated circuits. To satisfy the trend of increasingly faster speed, the drive currents of transistors need to be increasingly greater. To achieve this increase in performance, the gate lengths of transistors are scaled down. Scaling down the gate lengths leads to undesirable effects known as "short-channel effects," in which the control of current flow by the gates is compromised. Among the short-channel effects are the Drain-Induced Barrier Lowering (DIBL) and the degradation of sub-threshold slope, both of which result in the degradation in the performance of transistors.

For example, multi-gate devices have been introduced in an effort to improve gate control by increasing gate-channel coupling, reduce OFF-state current, and reduce short-channel effects (SCEs). One such multi-gate device is horizontal gate-all-around (HGAA) transistor, whose gate structure extends around its horizontal channel region providing access to the channel region on all sides or three sides. The HGAA transistors are compatible with complementary metal-oxide-semiconductor (CMOS) processes, allowing them to be aggressively scaled down while maintaining gate control and mitigating SCEs. However, fabrication of the HGAA transistors can be challenging. For example, nanosheet formation of HGAA transistors by the current methods is not satisfactory in all respects, especially when using a single process, such as a single epitaxial process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17A-23B are various cross-sectional views of a GAA device at different stages of fabrication, according to some embodiments of the disclosure.

DETAILED DESCRIPTION

Figure 1:
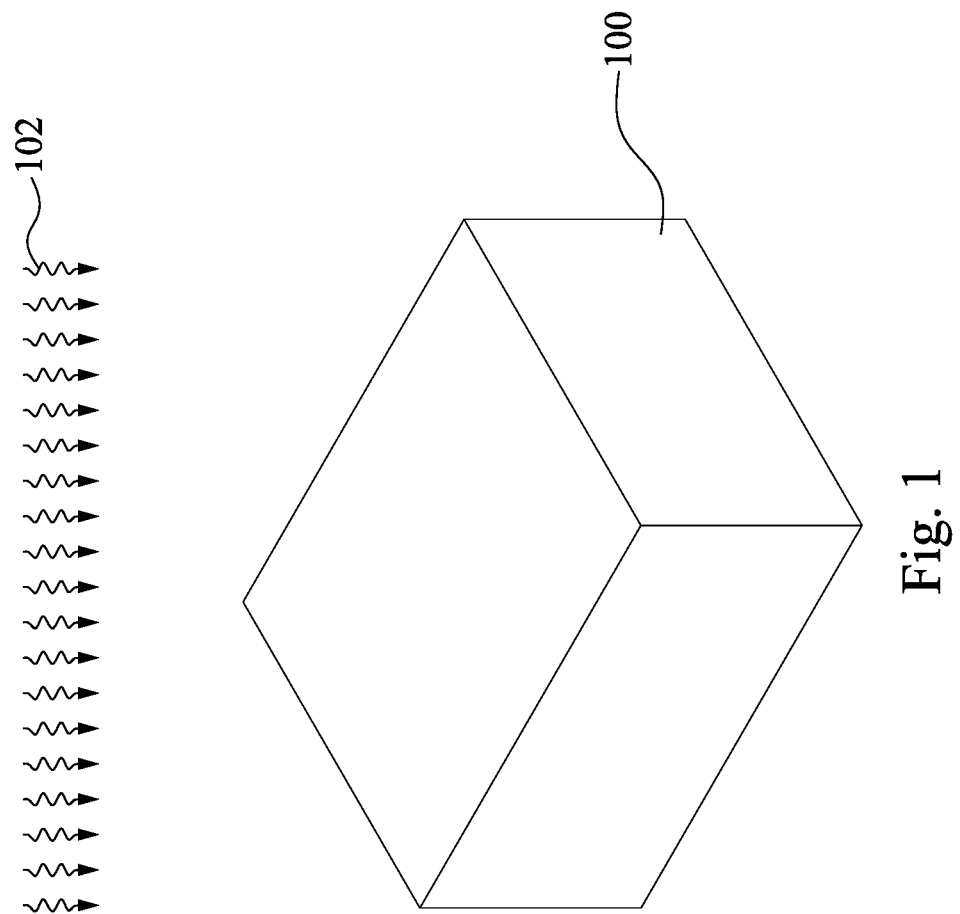
FIGS. 1-16 are exemplary sequential processes for manufacturing the gate-all-around (GAA) FET device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In certain embodiments, the term "about" used in this context means greater or less than the stated value or the stated range of values by a percentage such as 5%, 10%, 15%, etc. of the stated values.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Reference is now made to FIGS. 1-16, which are exemplary sequential processes for manufacturing the gate-all-around (GAA) FET device according to some embodiments of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

Referring to FIG. 1, impurity ions (dopants) 102 are optional implanted into a substrate 100 to form a well region. The ion implantation is performed to prevent a punch-through effect. In some embodiments, the substrate 100 may include in its surface region, one or more buffer layers (not shown). The buffer layers can serve to gradually change the lattice constant from that of the substrate to that of the source/drain regions. The substrate 100 may include various regions that have been suitably doped with impurities (e.g., p-type or n-type conductivity). The dopants 102 are, for example, phosphorus for a p-type Fin FET.

Figure 2:
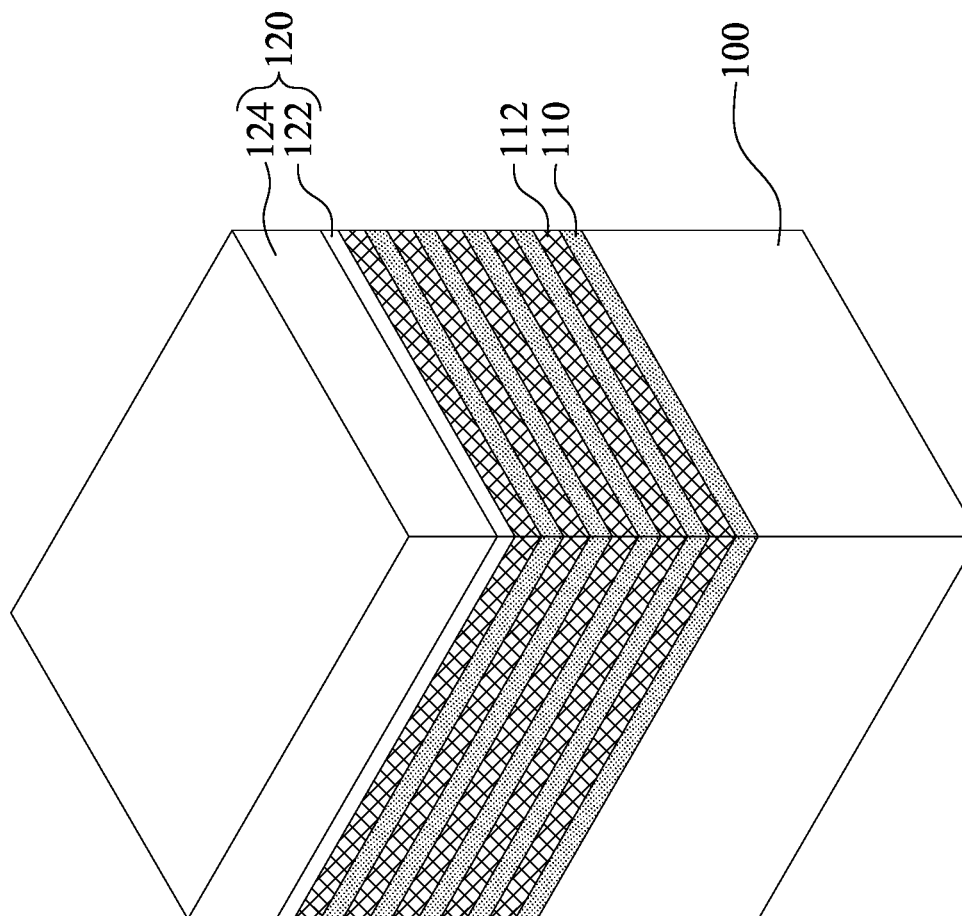

Referring to FIG. 2, stacked semiconductor layers are formed over the substrate 100. The stacked semiconductor layers include first semiconductor layers 110 and second semiconductor layers 112. Further, a mask layer 120 is formed over the stacked layers.

The first semiconductor layers 110 and the second semiconductor layers 112 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 110 and the second semiconductor layers 112 are made of Si, a Si compound, SiGe, Ge or a Ge compound. In FIG. 2, five layers of the first semiconductor layer 110 and five layers of the second semiconductor layer 112 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 110 and the second semiconductor layers 112 are epitaxially formed over the substrate 100. In some embodiments, the bottommost first semiconductor layer 110 (the closest layer to the substrate 100) is thicker than the remaining first semiconductor layers 110.

Figure 3:
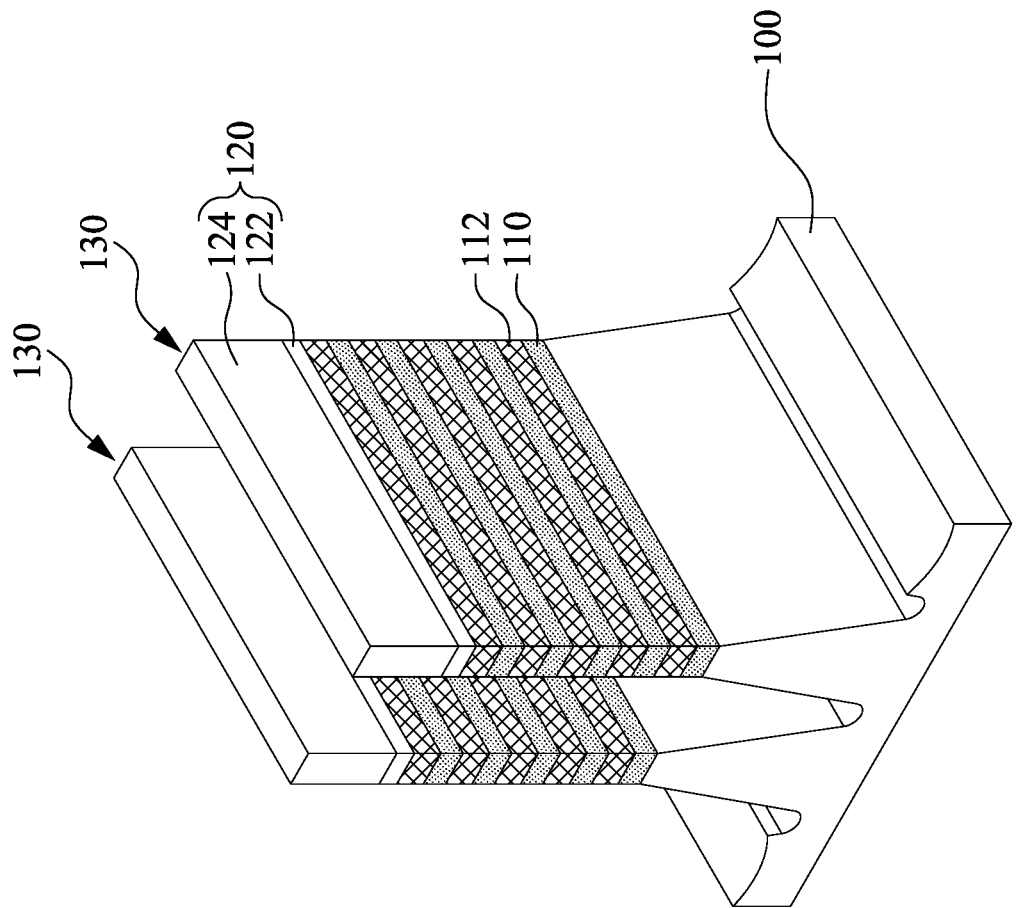

In some embodiments, the mask layer 120 includes a first mask layer 122 and a second mask layer 124. The first mask layer 122 is a pad oxide layer made of a silicon oxide, which can be formed by a thermal oxidation. The second mask layer 124 is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 120 is then patterned into a mask pattern by using patterning operations including photo-lithography and etching. Next, as shown in FIG. 3, the stacked layers of the first and second semiconductor layers 110, 112 are patterned by using the patterned mask layer, thereby the stacked layers are formed into fin structures 130 extending in the X direction. In FIG. 3, two fin structures 130 are arranged in the Y direction. But the number of the fin structures is not limited to, and may be as small as one and three or more. In some embodiments, one or more dummy fin structures are formed on both sides of the fin structures 130 to improve pattern fidelity in the patterning operations.

Figure 4:
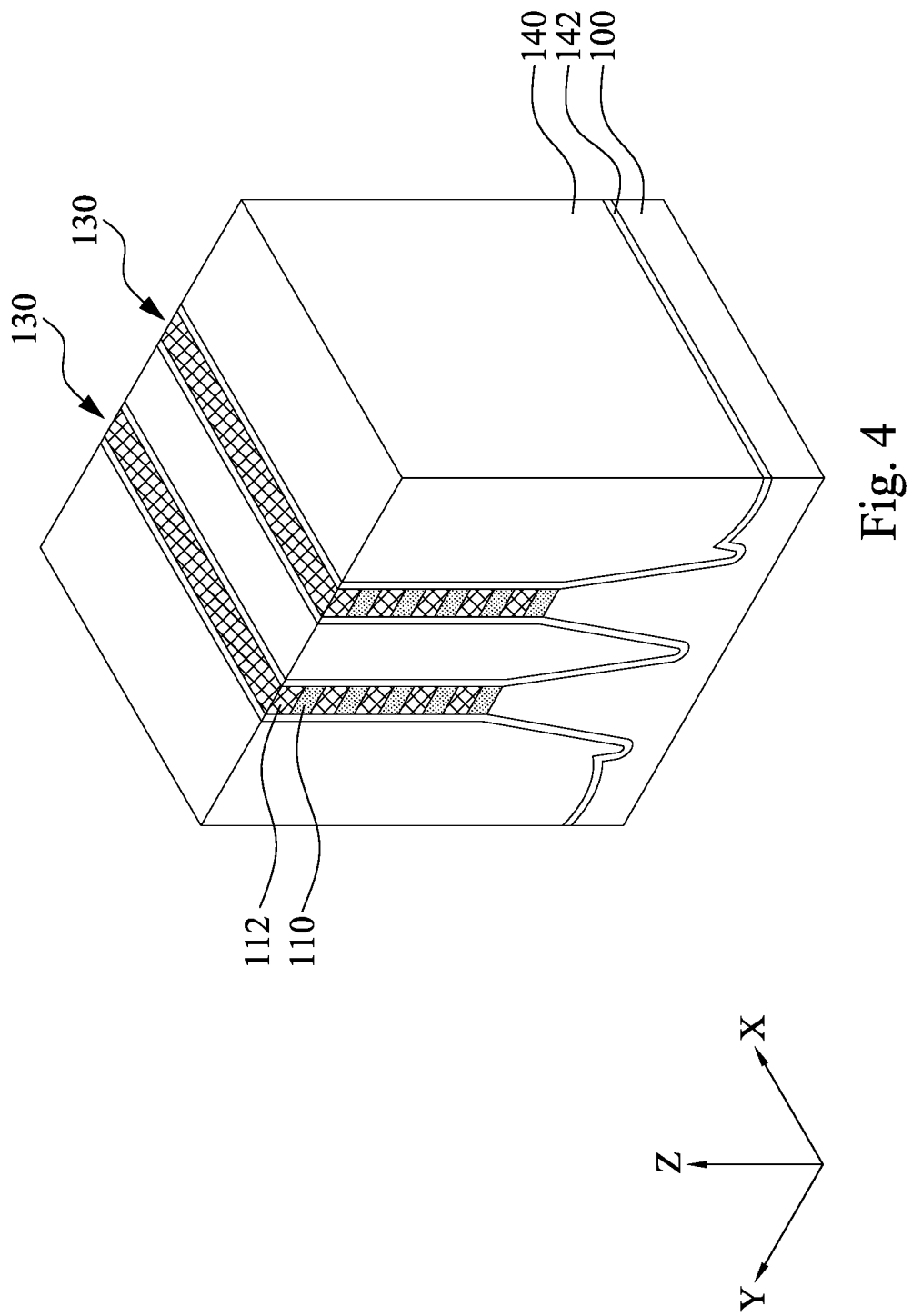

Referring to FIG. 4, after the fin structures 130 is formed, an insulating material layer 140 including one or more layers of insulating material is formed over the substrate so that the fin structures 130 are fully embedded in the insulating material layer 140. The insulating material for the insulating material layer 140 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer 140. Then, a planarization operation, such as a chemical mechanical polishing (CMP) method and/or an etch-back method, is performed such that the upper surface of the uppermost second semiconductor layer 112 is exposed from the insulating material layer 140. In some embodiments, a first liner layer 142 is formed over the structure of FIG. 3 before forming the insulating material layer 140. The first liner layer 142 is made of SiN or a silicon nitride-based material (e.g., SiON, SiCN or SiOCN).

Figure 5:
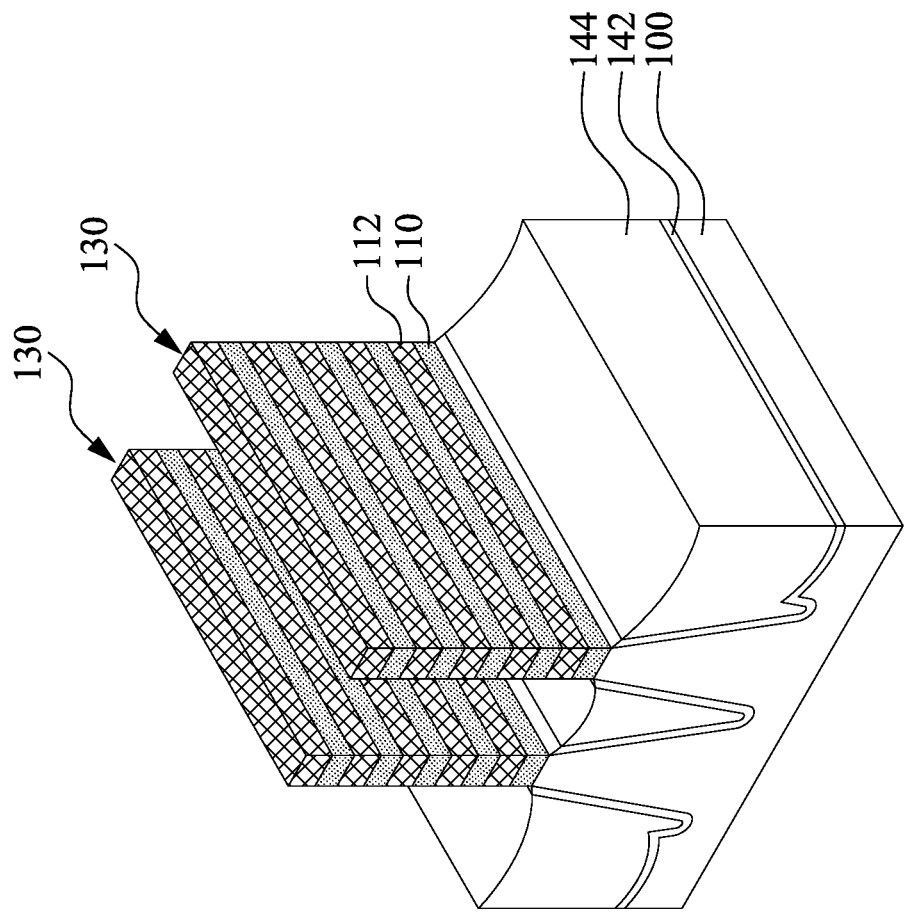

Then, as shown in FIG. 5, the insulating material layer 140 (as shown in FIG. 4) is recessed to form an isolation insulating layer 144 so that the upper portions of the fin structures 130 are exposed. With this operation, the fin structures 130 are electrically insulated from each other by the isolation insulating layer 144, which is also referred to as a STI structure. In some embodiments, the insulating material layer 140 is recessed until the bottommost first semiconductor layer 110 is exposed. The first semiconductor layers 110 are sacrificial layers which are subsequently partially removed, and the second semiconductor layers 112 will serve as channel regions of a GAA FET.

Figure 6:
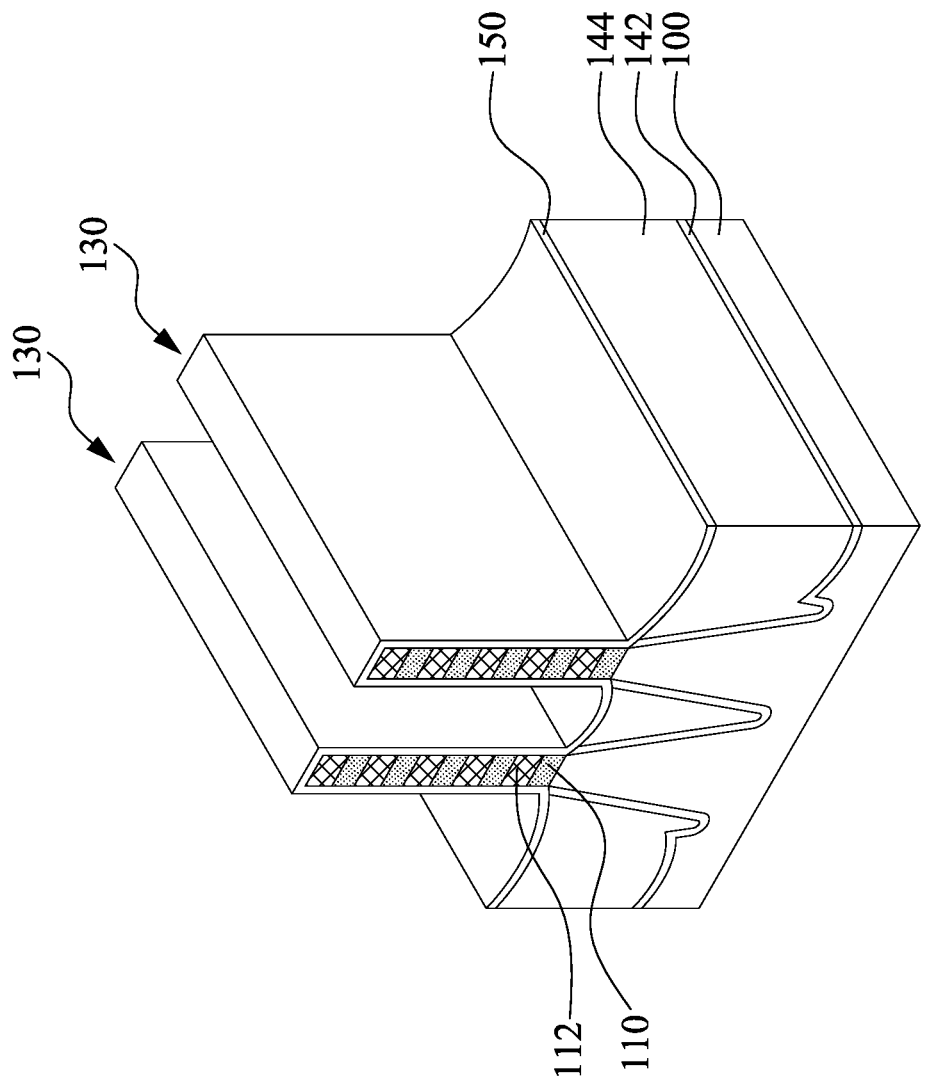

After the isolation insulating layer 144 is formed, a sacrificial gate dielectric layer 150 is formed, as shown in FIG. 6. The sacrificial gate dielectric layer 150 includes one or more layers of insulating material, such as a silicon oxide-based material. In one embodiment, silicon oxide formed by CVD is used.

Figure 7:
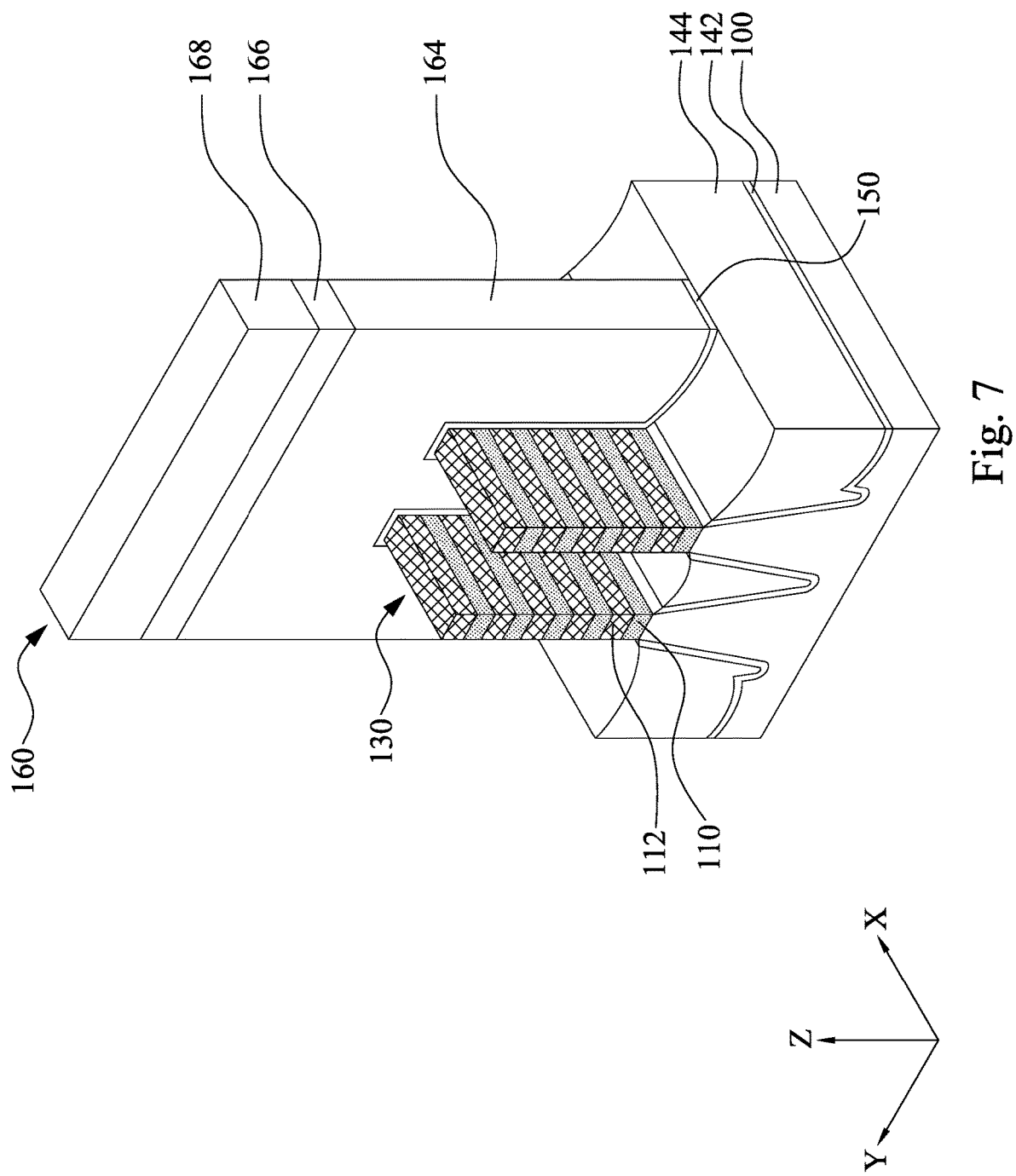

Afterwards, a sacrificial gate layer and a mask layer (e.g., having a pad SiN layer and a silicon oxide mask layer) are formed over the sacrificial gate dielectric layer 150, followed by patterning the mask layer, the sacrificial gate electrode layer and the sacrificial gate dielectric layer 150 into the sacrificial gate structure 160, as shown in FIG. 7. The sacrificial gate structure 160 includes the sacrificial gate dielectric layer 150, the sacrificial gate electrode layer 164 (e.g., poly silicon), the pad SiN layer 166 and the silicon oxide mask layer 168. The stacked layers of the first and second semiconductor layers 110, 112 are partially exposed on opposite sides of the sacrificial gate structure 160, thereby defining source/drain (S/D) regions. In this disclosure, a source and a drain are interchangeably used and the structures thereof are substantially the same.

Figure 8:
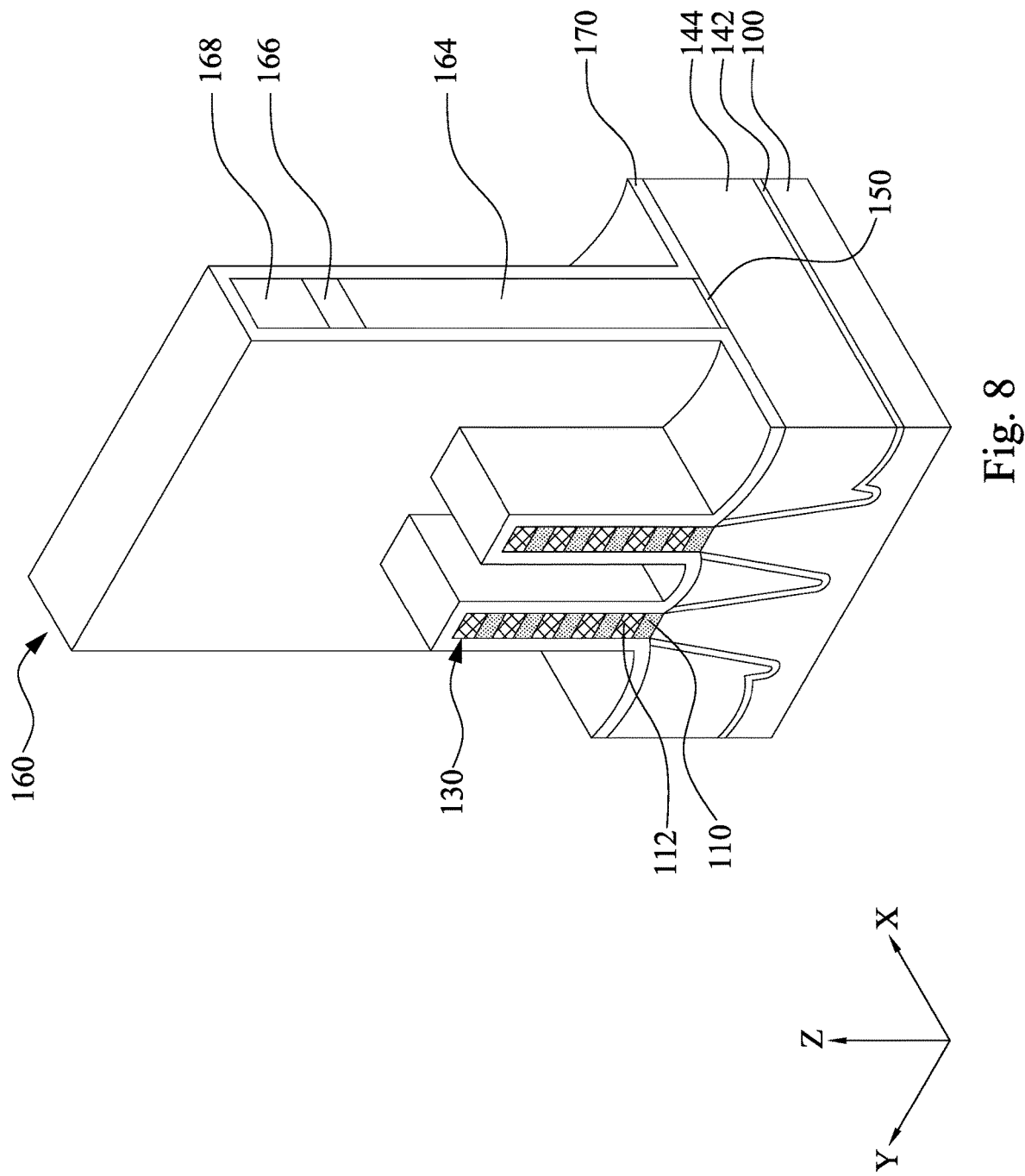

Referring to FIG. 8, after the sacrificial gate structure 160 is formed, a blanket layer 170 of an insulating material for sidewall spacers is conformally formed by using CVD or other suitable methods. The blanket layer 170 is deposited in a conformal manner so that it is formed to have substantially equal thicknesses on vertical surfaces, such as the sidewalls, horizontal surfaces, and the top of the sacrificial gate structure. In some embodiments, the blanket layer 170 is deposited to a thickness in a range from about 2 nm to about 10 nm. In one embodiment, the insulating material of the blanket layer 170 is a silicon nitride-based material, such as SiN, SiON, SiOCN or SiCN and combinations thereof.

Figure 9A:
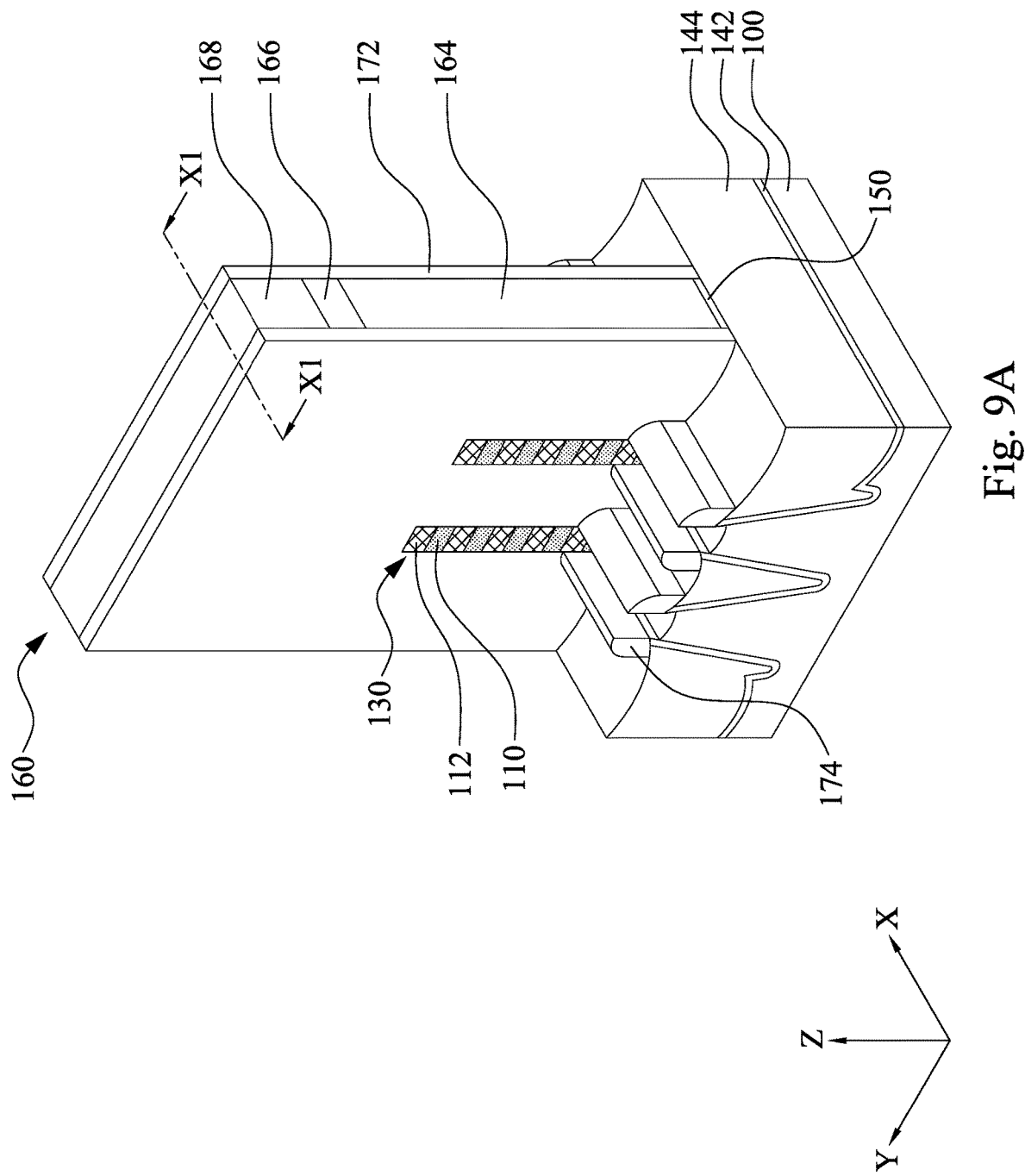

The blanket layer 170 is then etched using an anisotropic process to form gate sidewall spacers 172 on opposite sidewalls of the sacrificial gate structure 160 and fin sidewall spacers 174 on opposite sidewalls of the fin structures 130, followed by etching exposed portions of the fin structures 130 that extend laterally beyond the gate sidewall spacers 172. The resulting structure is illustrated in FIGS. 9A and 9B, wherein FIG. 9B is the cross sectional view corresponding to line X1-X1 of FIG. 9A. In FIG. 9B, the cross section of the bottom parts of one sacrificial gate structure 160 is illustrated. In some embodiments, the anisotropic process can be control such that no fin sidewall spacers 174 remain on the STI region 144.

The anisotropic etching performed on the blanket layer 170 can be, for example, reactive ion etching (RIE). During the anisotropic etching process, most of the insulating material is removed from horizontal surfaces, leaving the dielectric spacer layer on the vertical surfaces such as the sidewalls of the sacrificial gate structures 160 and the sidewalls of the exposed fin structures 130. The mask layer 168 may be exposed from the sidewall spacers.

Figure 10A:
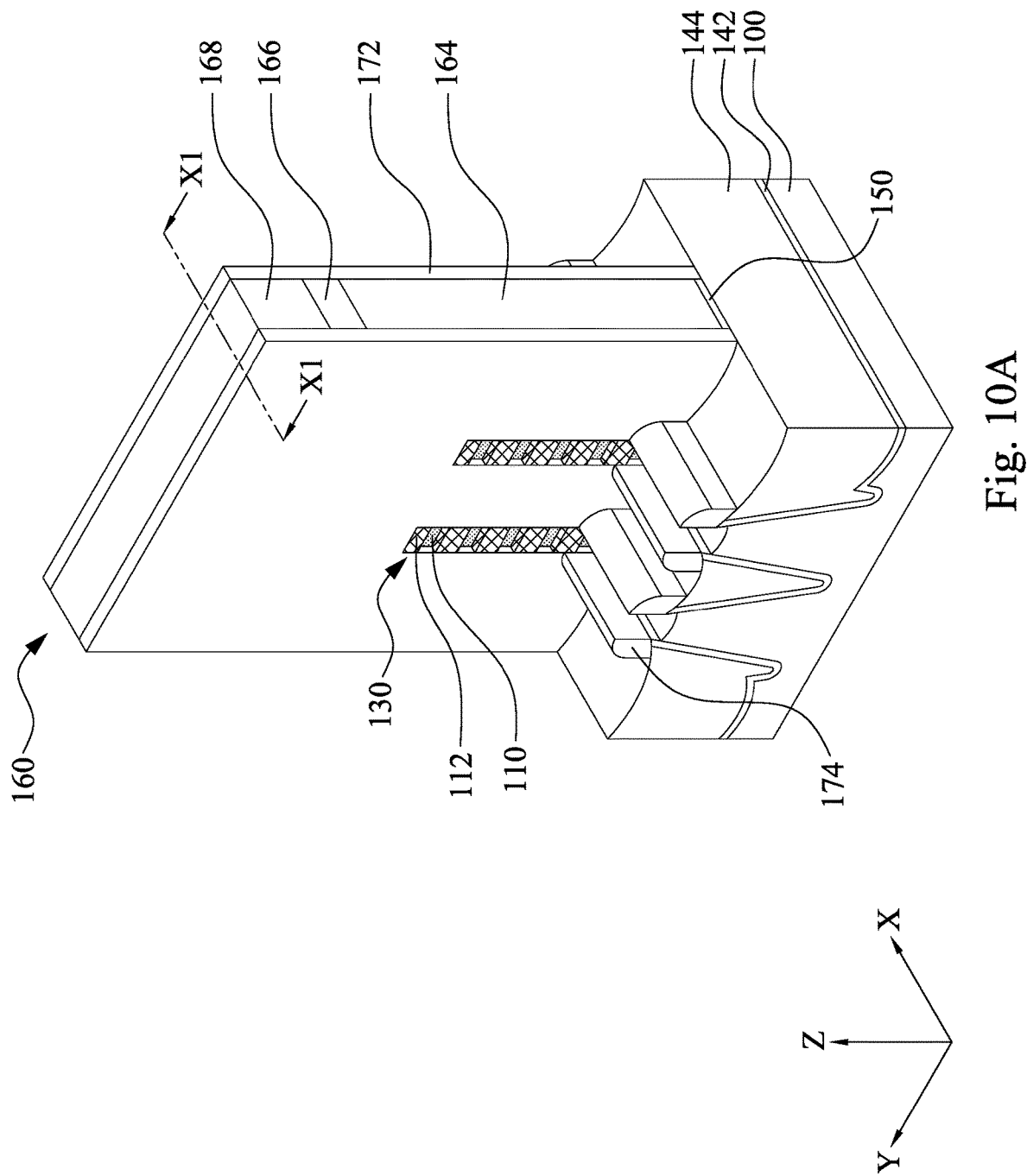
Figure 10B:
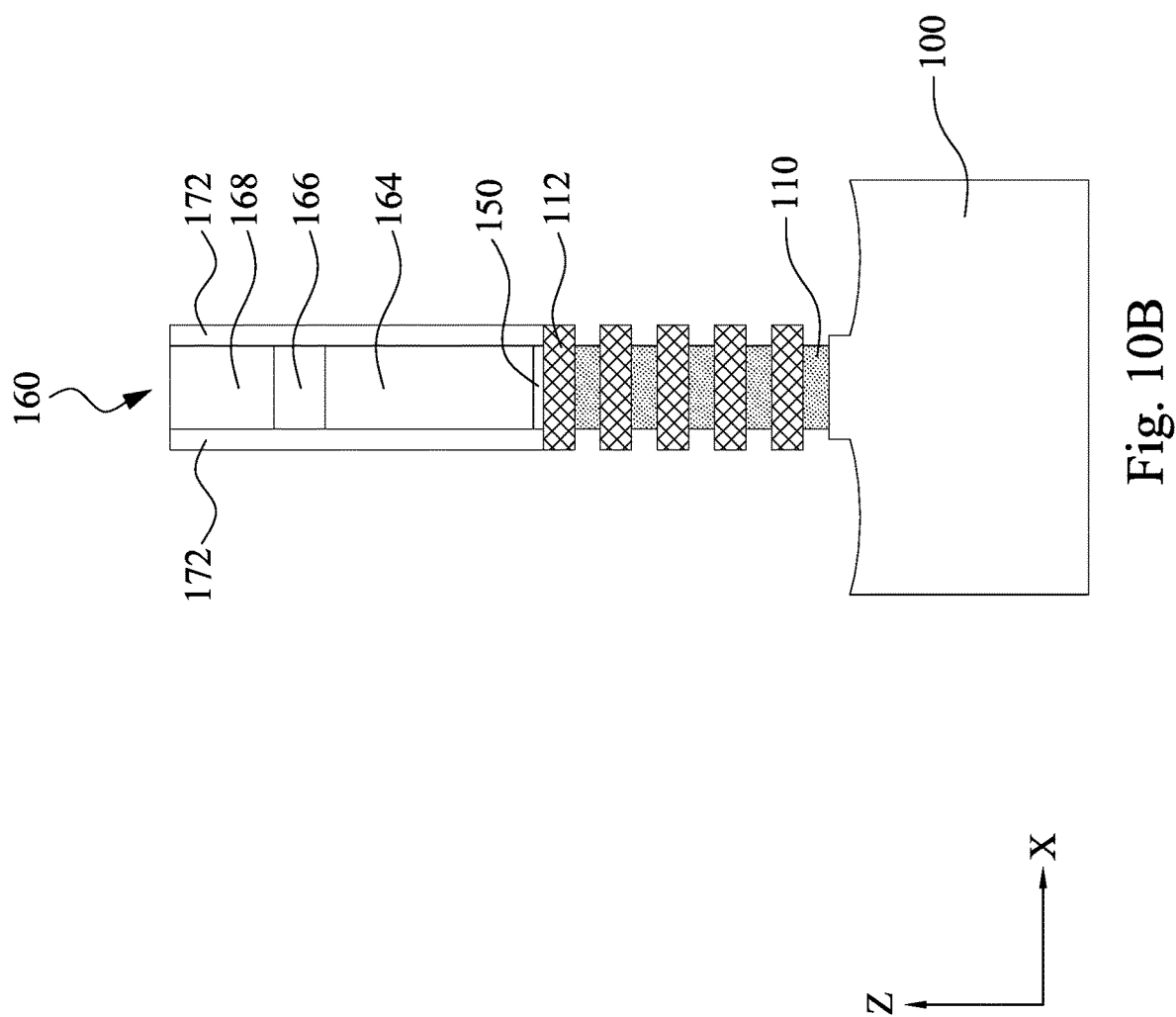

Subsequently, as shown in FIGS. 10A and 10B, the first semiconductor layers 110 are horizontally recessed (etched) so that the second semiconductor layers 112 laterally extend past opposite end surfaces of the first semiconductor layers 110. In some embodiments, as shown in FIG. 10B, end surfaces of the first semiconductor layers 110 may be substantially vertically aligned with the side surfaces of the sacrificial gate electrode layer 164. Here, "substantially vertically alignment" means the horizontal offset is less than about 1 nm.

During the recess etching of the first semiconductor layers 110 as illustrated in FIGS. 10A and 10B, the second semiconductor layers 112 may be also horizontally etched. The recessed amount of the first semiconductor layers 110 is greater than the recessed amount of the second semiconductor layers 112. In this way, the resulting second semiconductor layers 112 can laterally extend past opposite end surfaces of the first semiconductor layers 110.

Figure 11A:
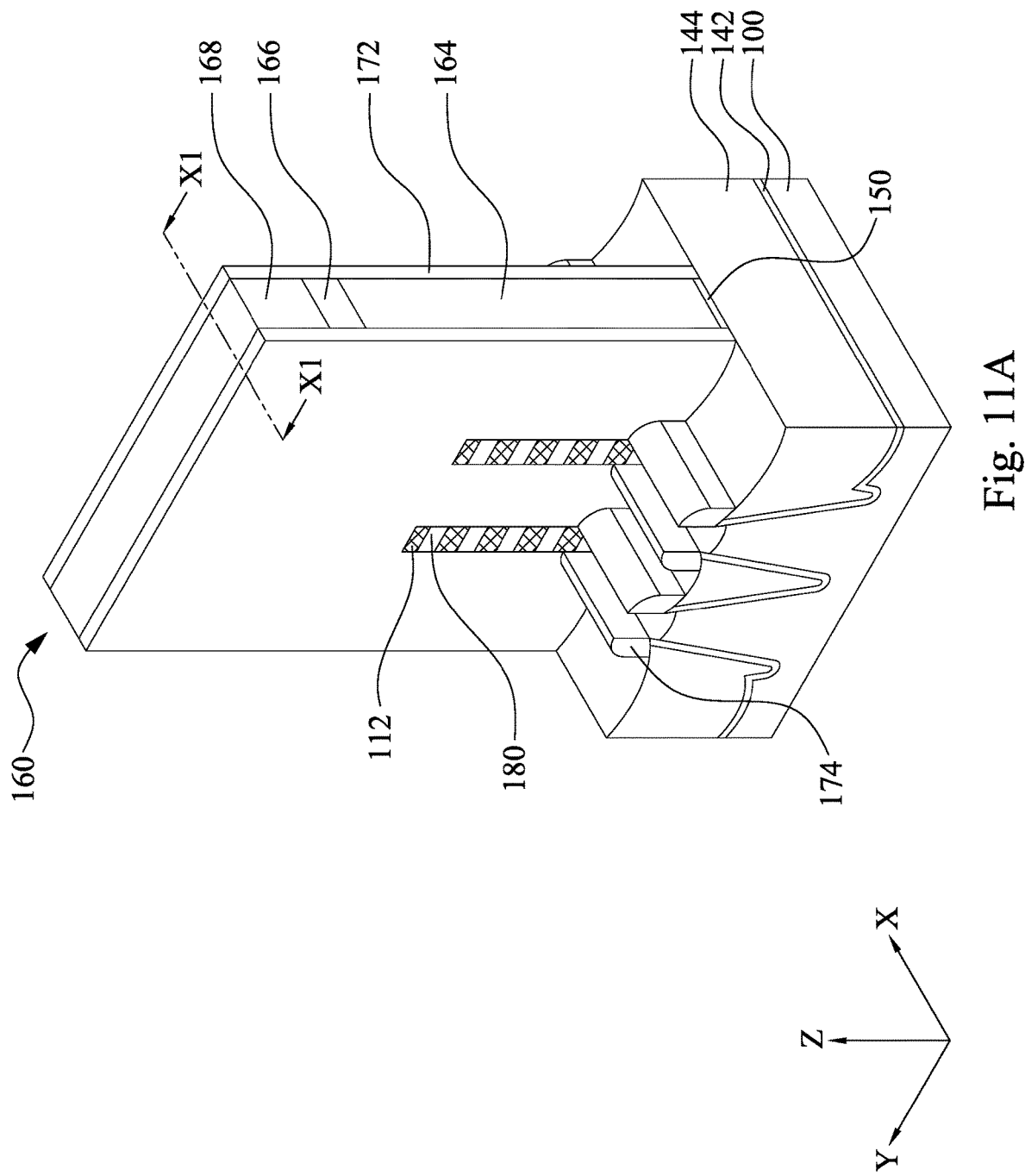
Figure 11B:
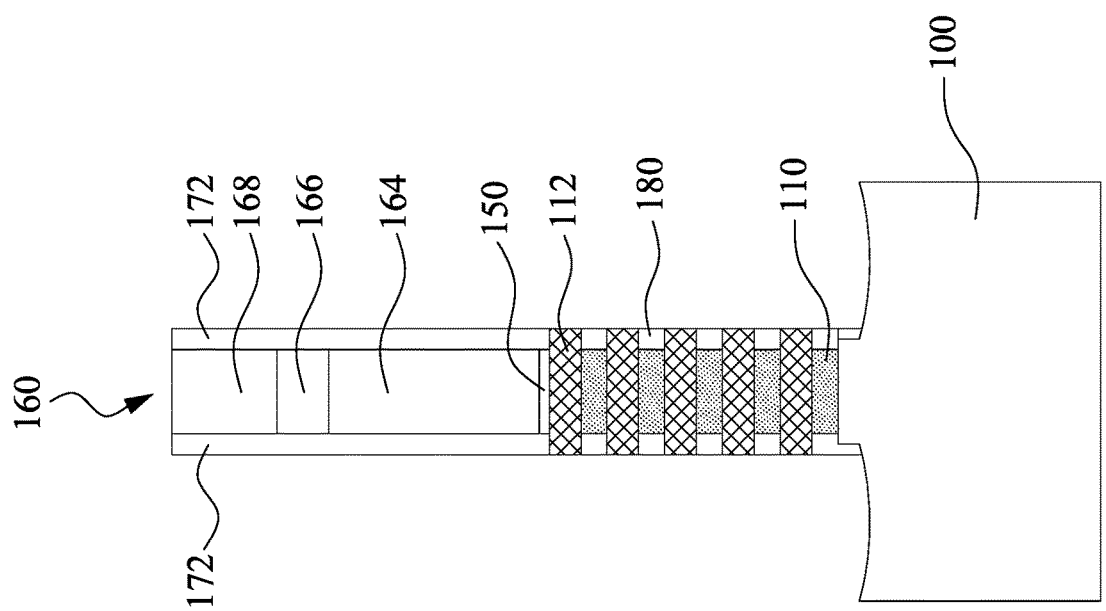

After the first semiconductor layers 110 are horizontally recessed, inner spacers 180 are formed on the recessed surfaces of the first semiconductor layers 110, and vertically between corresponding second semiconductor layers, as shown in FIGS. 11A and 11B. Formation of the inner spacers 180 includes depositing an inner spacer material layer (e.g., silicon nitride), followed by etching back the inner spacer material layer by an anisotropic etching process, to remove the inner spacer material layer from the substrate 100.

In some embodiments, the inner spacers 180 include insulating material such as silicon nitride or the like.

Figure 12:
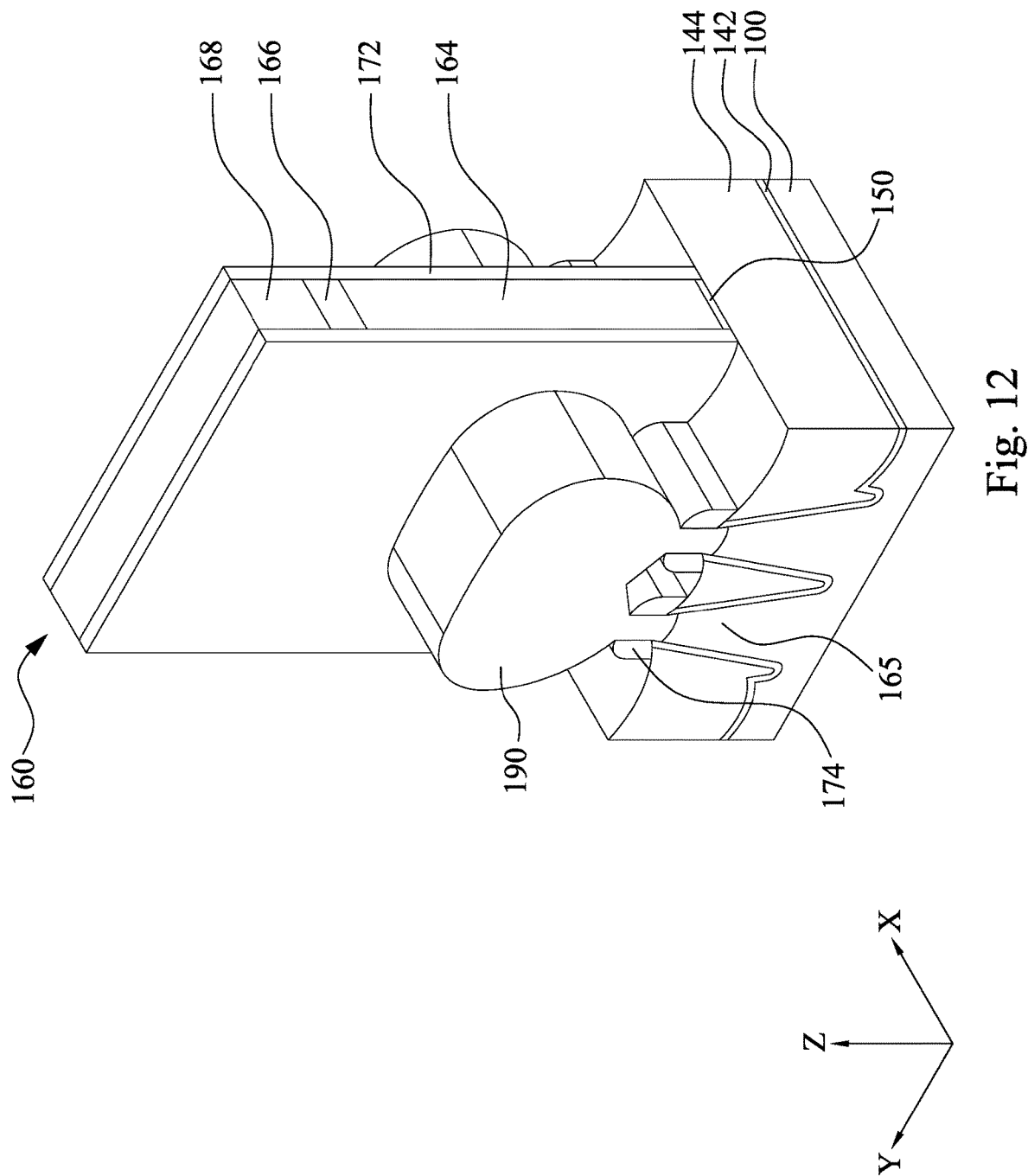

After the inner spacers 180 are formed, source/drain (S/D) epitaxial layers 190 are epitaxially grown from the exposed recessed fins 165 between the fin sidewall spacers 174, as shown in FIG. 12. The S/D epitaxial layers 190 include one or more layers of SiGe doped with p-type dopants (e.g., boron, aluminum, or other suitable p-type dopants) for a p-channel FET. The S/D epitaxial layers 190 include one or more layers of SiC or SiP doped with n-type dopants (e.g., phosphorous, arsenic, or other suitable n-type dopants) for an n-channel FET. The S/D epitaxial layers 190 are formed by an epitaxial growth method using CVD, ALD or molecular beam epitaxy (MBE). In some embodiments, the epitaxial layers 190 grown from neighboring recessed fins 165 of the substrate 100 merge above the STI 144 and form a void in some embodiments. In some other embodiments, the epitaxial layers 190 grown from neighboring recessed fins 165 do not merged.

Figure 13:
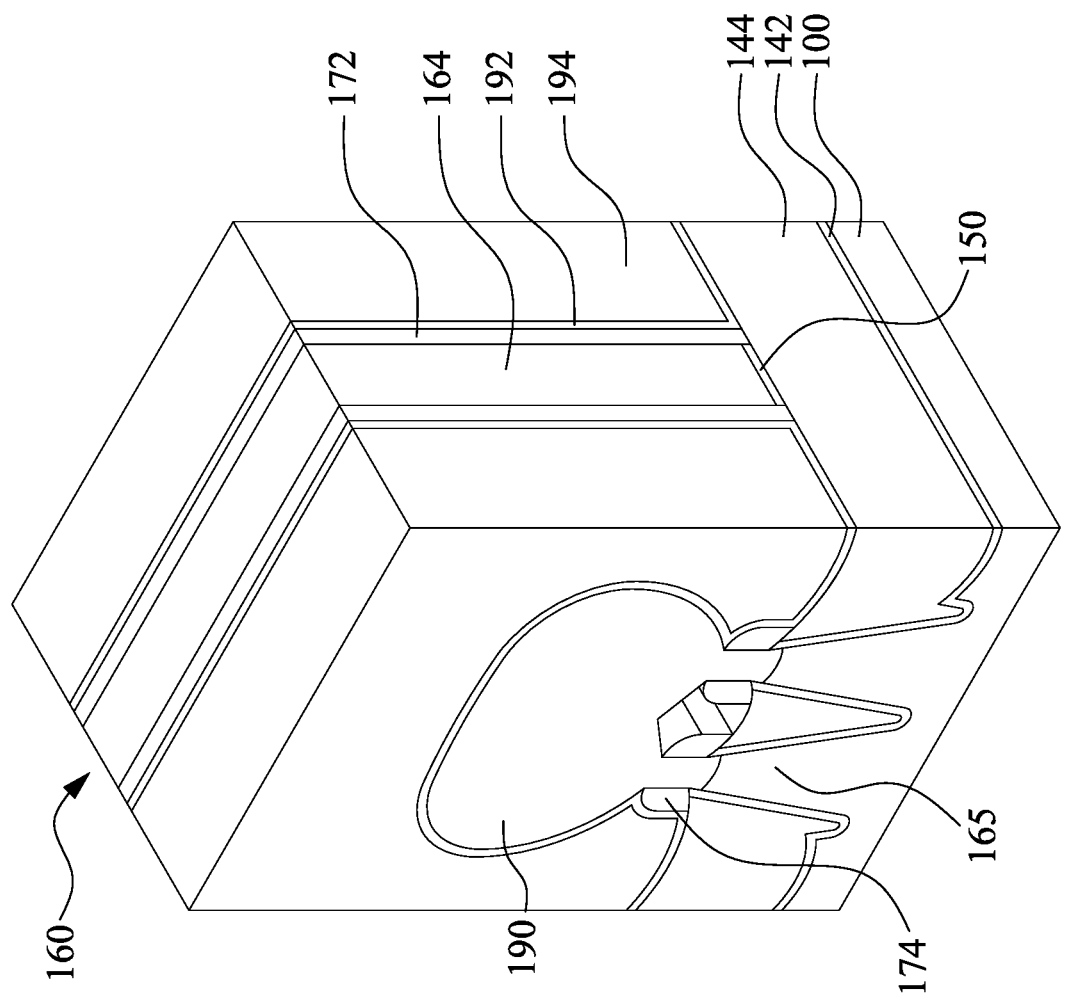

Subsequently, a second liner layer 192 is formed and then an interlayer dielectric (ILD) layer 194 is formed, as shown in FIG. 13. The second liner layer 192 is made of a silicon nitride-based material, such as SiN, and functions as a contact etch stop layer in the subsequent etching operations. The materials for the ILD layer 194 include compounds comprising Si, O, C and/or H, such as silicon oxide, SiCOH and SiOC. Organic materials, such as polymers, may be used for the ILD layer 194.

As shown in FIG. 13, after the ILD layer 194 is formed, a planarization operation, such as CMP, is performed, so that the top portion of the sacrificial gate structure 160 is exposed.

Figure 14:
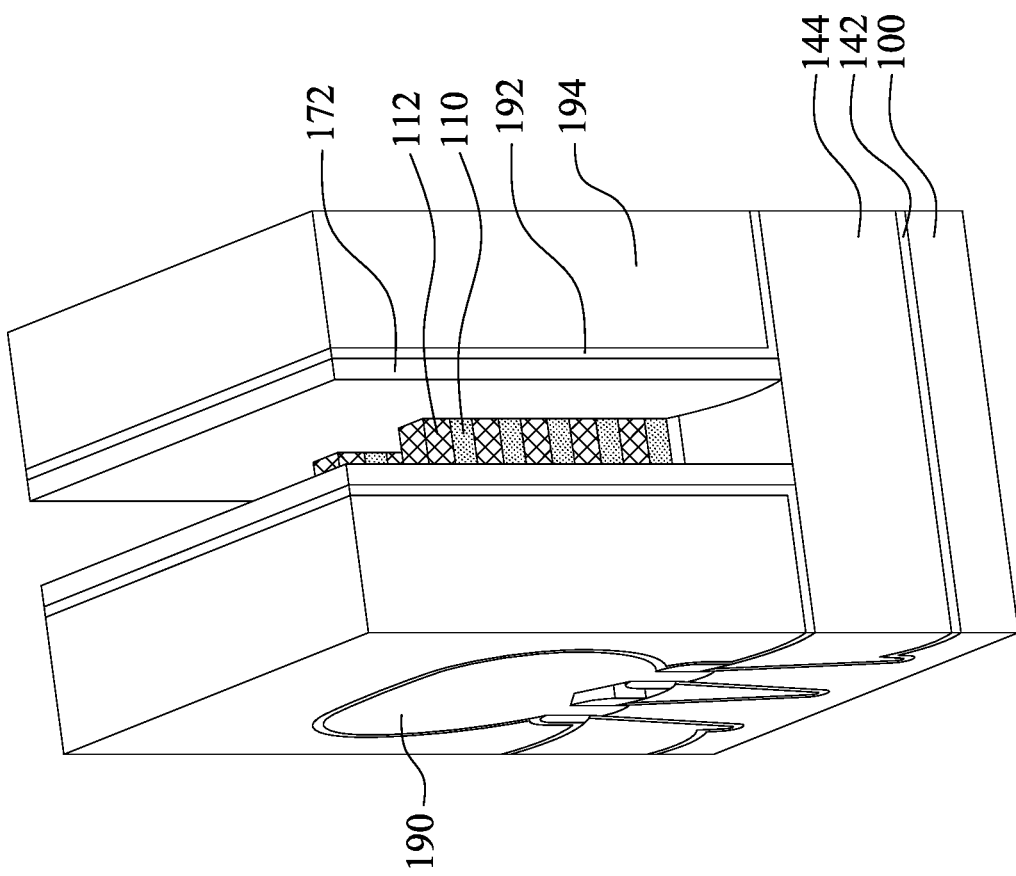

Next, as shown in FIG. 14, the sacrificial gate electrode layer 164 (see FIG. 9B) and sacrificial gate dielectric layer 150 (see FIG. 9B) are removed, thereby exposing the fin stack of the first and second semiconductor layers 110, 112 and a gate trench is formed between the gate spacers.

The ILD layer 194, the contact etch stop layer 192, the gate sidewall spacers 172, and/or the inner spacers 180 protect the S/D epitaxial layers 190 during the removal of the sacrificial gate structures. The sacrificial gate structures can be removed using plasma dry etching and/or wet etching. When the sacrificial gate electrode layer 164 is polysilicon and the ILD layer 194 is silicon oxide, a wet etchant such as a TMAH solution can be used to selectively remove the sacrificial gate electrode layer 164. The sacrificial gate dielectric layer 150 is thereafter removed using plasma dry etching and/or wet etching.

Figure 15A:
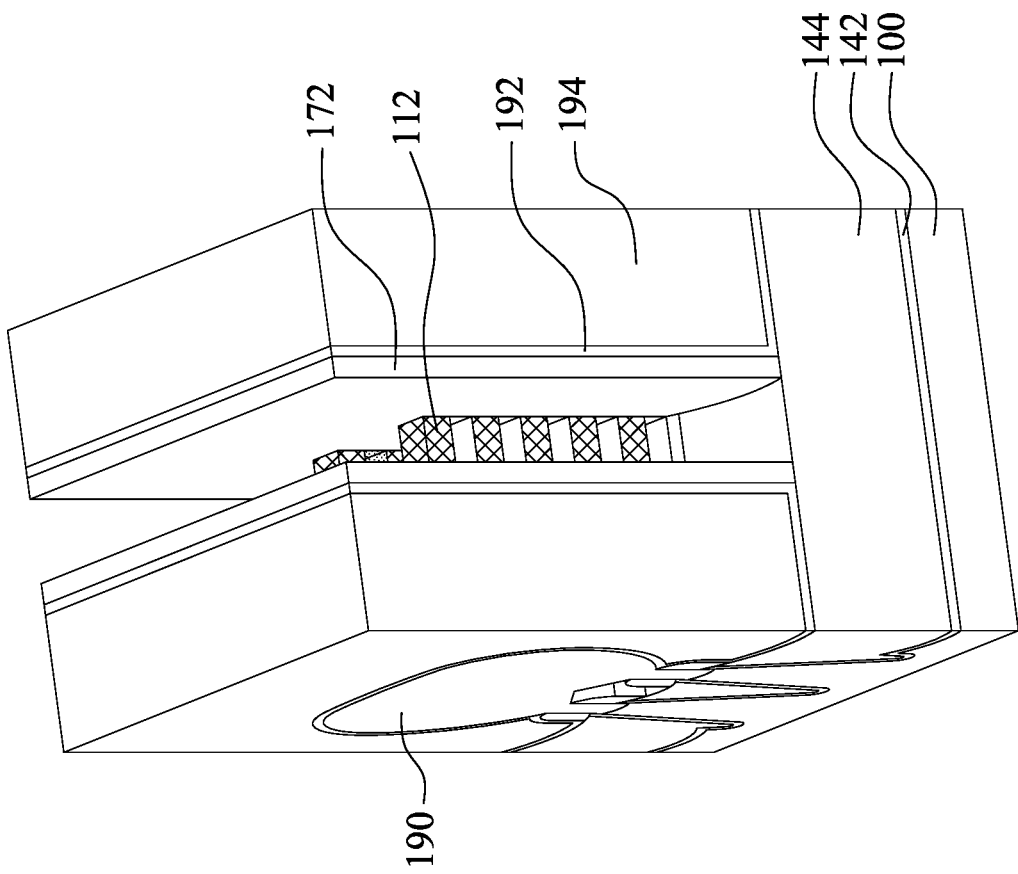
Figure 15B:
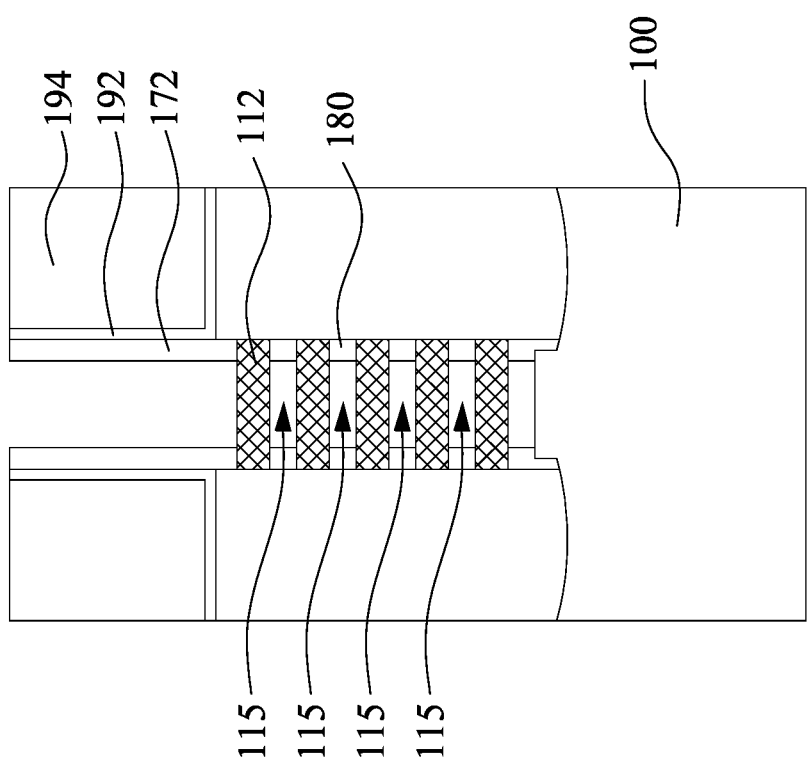

After the sacrificial gate structures are removed, the first semiconductor layers 110 (as shown in FIG. 14) in the fin structures are removed, as shown in FIGS. 15A and 15B. That is, the first semiconductor layers 110 (see FIG. 14) are etched. As a result, portions of the second semiconductor layers 112 are suspended. In the following discussion, the portions of the second semiconductor layers 112 suspended are also referred to as and serve as the channel layers (or nanosheets). The channel layers 112 are slightly etched or not etched. In the present embodiments, the channel layers 112 are slightly etched to form a rectangular-like shape (e.g., a nanosheets). FIG. 15B is the cross sectional view along the fin structure. Gaps 115 are left between neighboring channel layers 112. The first semiconductor layers 110 can be removed or etched using an etchant that can selectively etch the first semiconductor layers 110 at a faster etching rate than etching the second semiconductor layers 112. The channel layers 112 extend in the X-direction above the substrate 100 and are arranged in the Z direction perpendicular to the X-direction.

In some embodiments, the first semiconductor layers 110 (also called sacrificial layers to be removed) are SiGe and the second semiconductor layers 112 (also called channel layers to be left in final GAA transistors) are silicon allowing for the selective removal of the first semiconductor layers 110. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 112 may not be significantly etched by the channel release process.

In the present embodiment, since the inner spacers 180 are made of a material that has etching selectivity to that of the first semiconductor layers 110, the inner spacers 180 can protect the source/drain epitaxial layers 190 from the etchant used in etching the first semiconductor layers 110.

Figure 16:
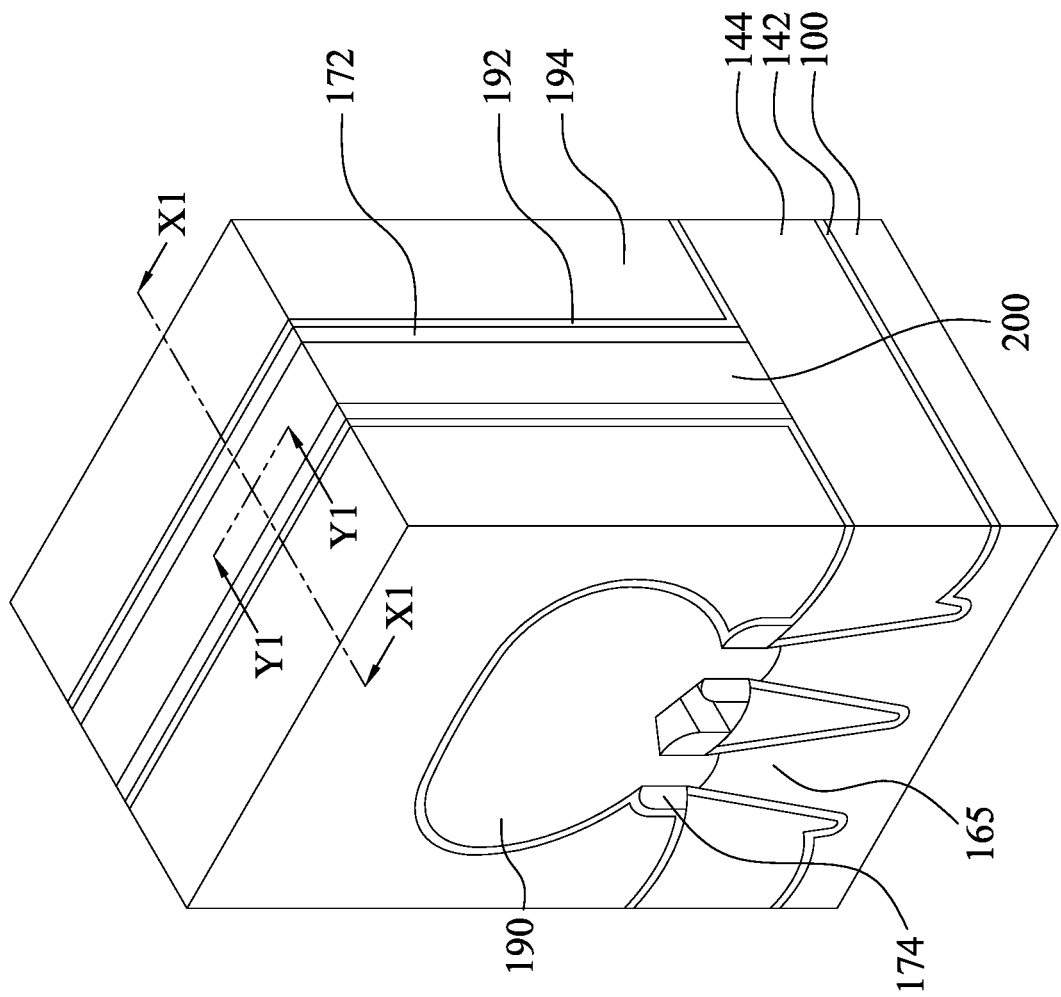

Referring to FIG. 16, a metal gate structure 200 is formed around each channel layers 112. The metal gate structure 200 extends in a Y-direction. The metal gate structure 200 extends in a Y direction which is perpendicular to the X direction and the Z direction. The exemplary sequential processes of the formation of the metal gate structure 200 will be discussed in the following figures.

Figure 17B:
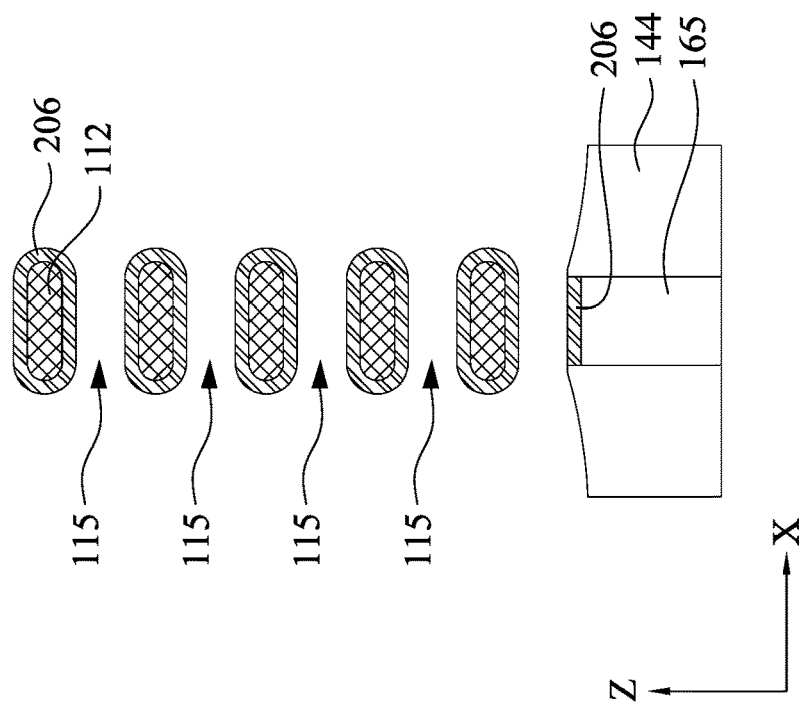
Figure 17A:
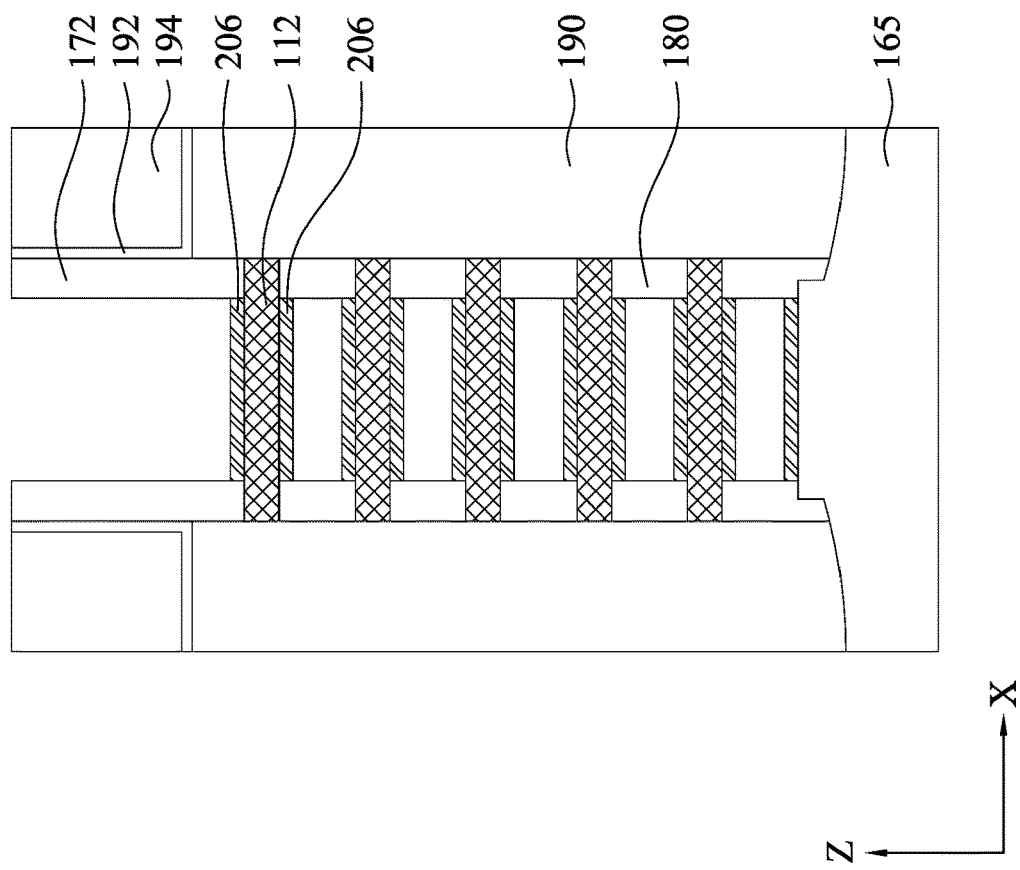

FIGS. 17A-21B are various cross-sectional views of a GAA device at different stages of fabrication, according to some embodiments of the disclosure, in which "A" are the cross sectional views corresponding to line X1-X1 of FIG. 16, and "B" are the cross sectional views corresponding to line Y1-Y1 of FIG. 16. FIGS. 17A and 17B follow after FIGS. 15A and 15B.

After the first semiconductor layers 110 are removed, interfacial layers 206 are formed on surface of the channel region, e.g., the surface of the channel layers 112, and on the surface of the recessed fins 165. The interfacial layers 206 are formed of silicon oxide or silicon oxynitride grown by a thermal oxidation process. For example, the interfacial layer 206 can be grown by wet oxidation, a rapid thermal oxidation (RTO) process or by an annealing process using oxygen. In some embodiments where the interfacial layers 206 are formed by oxidation, all exposed semiconductor surfaces may be oxidized, and thus exposed surfaces of the channel layers 112 and the recessed fins 165 are all coated with interfacial layers 206.

Figure 18B:
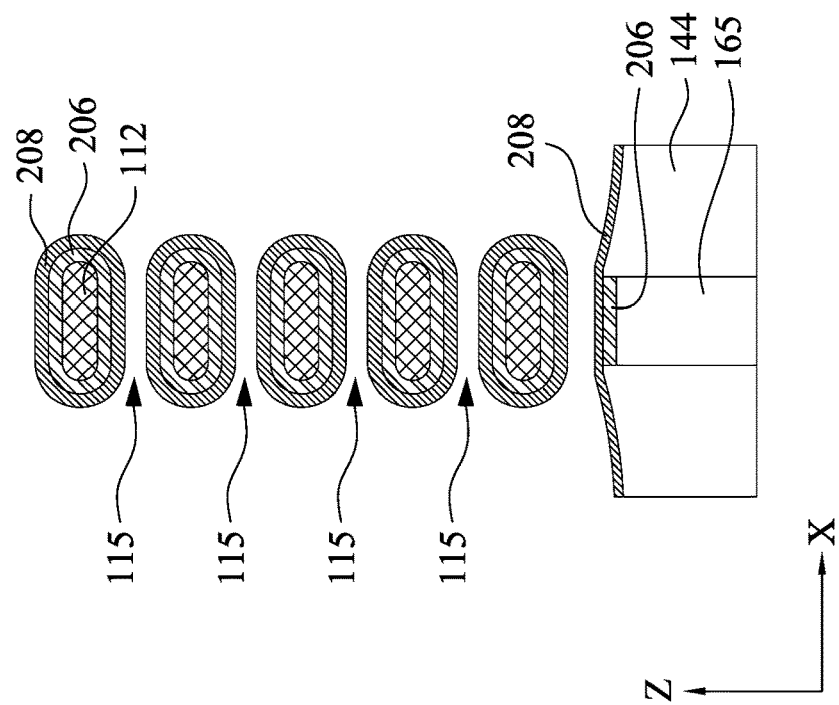
Figure 18A:
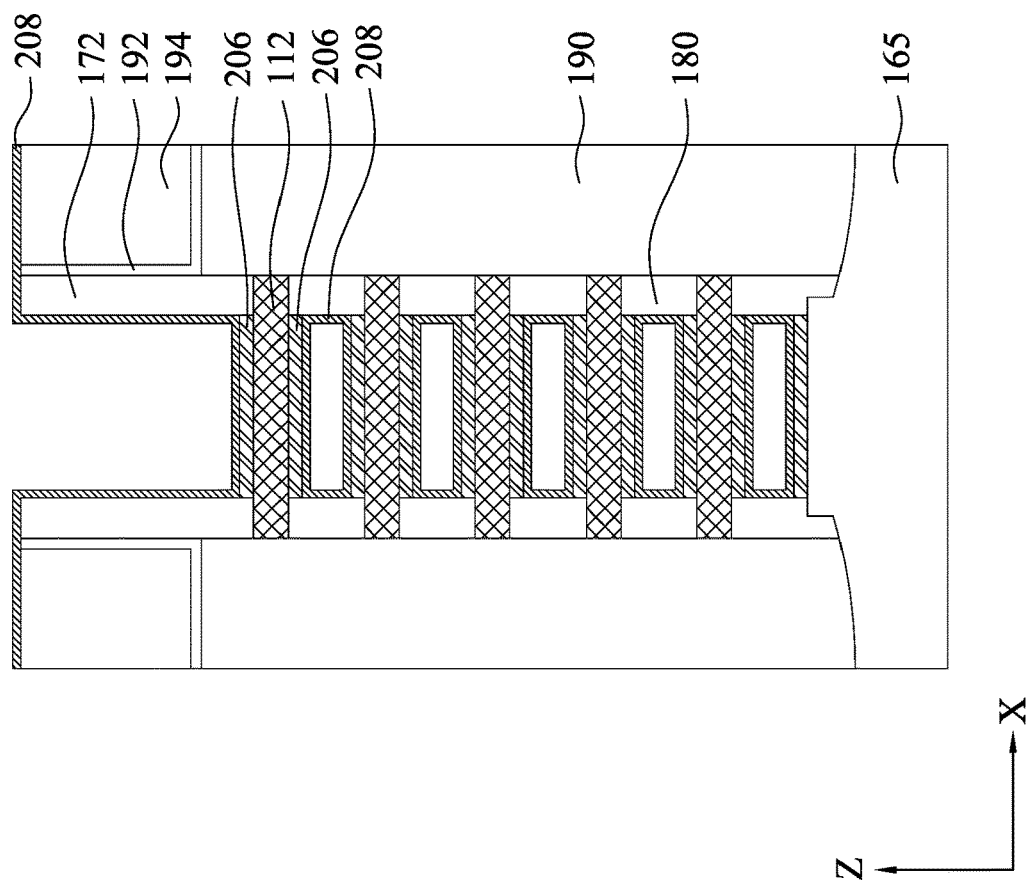

Referring to FIGS. 18A and 18B, after the interfacial layers 206 are formed, a high-k gate dielectric layer 208 is formed along the gate sidewall spacers 172, the surface of the inner spacer 180, the surface of the ILD layer 194 and the interfacial layer 206, by a deposition process. In some embodiments, the high-k gate dielectric layer 132 may include metal oxides. Examples of metal oxides used for high-k gate dielectric layer 132 include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The high-k dielectric layer 208 may be formed using a suitable process such as atomic layer deposition (ALD), chemical vapor deposition (CVD), physical vapor deposition (PVD) or other suitable method.

Figure 19B:
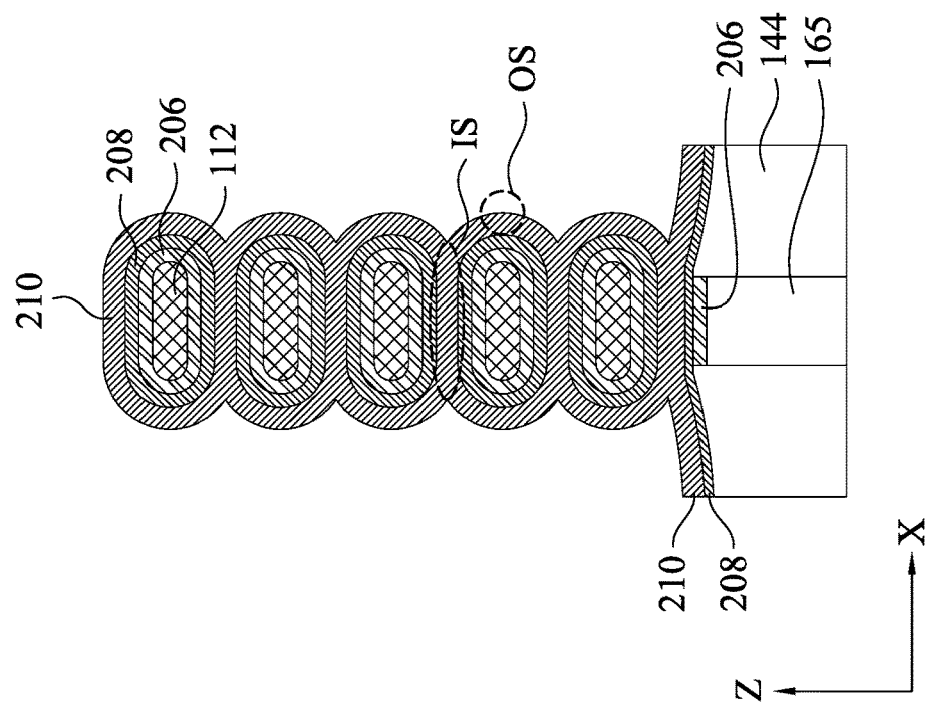
Figure 19A:
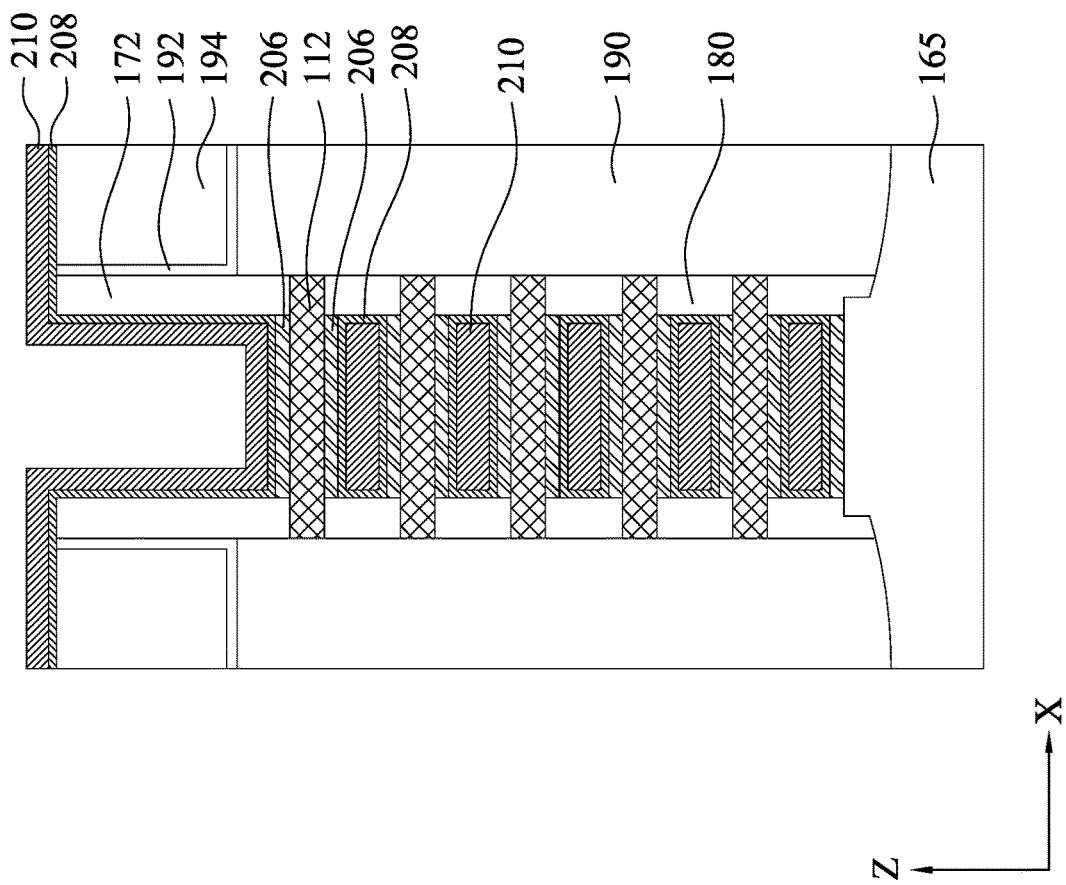

Reference is made to FIGS. 19A and 19B. A work function metal layer 210 is formed on the high-k gate dielectric layer 208. For example, the work function metal layer 210 is deposited to surround each of the channel layers (or nanosheets) 112. A portion of the work function metal layer 210 is formed vertically between adjacent channel layers (or nanosheets) 112 and fills the gap 113 between adjacent channel layers 112.

The work function metal layer 210 may be formed to provide a proper work function for the resulting gate structure. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials. If the P-metal is tungsten or tungsten nitride, it can be formed by a deposition process without using any fluorine-containing precursors, which will be explained in greater detail below.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

The work function metal layer 210 is a single-layer film or a multi-layer film. In some embodiments where the work function metal layer 210 is a multi-layer film, the work function metal layer may be a stack of one or more N-metal layers and one or more P-metal layers. In some embodiments, the work function metal layer 210 has a thickness greater than a thickness of the interfacial layer 206 and/or a thickness of the high-k gate dielectric layer 208. In some embodiments, the sheet-to-sheet gap between adjacent nanosheets 112 are small (e.g., having a gap height from about 5 nm to about 20 nm) as the GAA devices scale down, such that work function metal layers respectively deposited on the adjacent nanosheets 112 eventually merge as a single continuous work function metal layer 210 that fills up the small sheet-to-sheet gap. The work function metal layer 210 thus has inner-sheet regions IS vertically between corresponding nanosheets 112, and an outer-sheet region OS not vertically between any nanosheets 112.

Reference is made to FIGS. 20A and 20B. A glue layer 212 is formed on and surrounds the work function metal layer 210. The glue layer 212 may be used to increase adhesion between the work function metal layer 210 and a subsequently formed fill metal layer (see FIGS. 21A and 21B) so as to prevent the fill metal layer from peeling or delaminating. The glue layer 212 is a conformal layer and is conformally formed over the work function metal layer 210. In some embodiments, the glue layer 212 is a nitride layer. In some embodiments, the glue layer 212 is made of or includes TiN, TaN, TiAlN, TaCN, TaC or TaSiN, other suitable material, or a combination thereof and may be formed by CVD, ALD, PVD and/or other suitable process. In some embodiments, the glue layer 212 (e.g., TiN layer) has a thickness less than the thickness of the work function metal layer 210. In some further embodiments, the thickness of the glue layer 212 is also less than the thickness of the interfacial layer 206 and/or the thickness of the high-k gate dielectric layer 208.

Figure 21B:
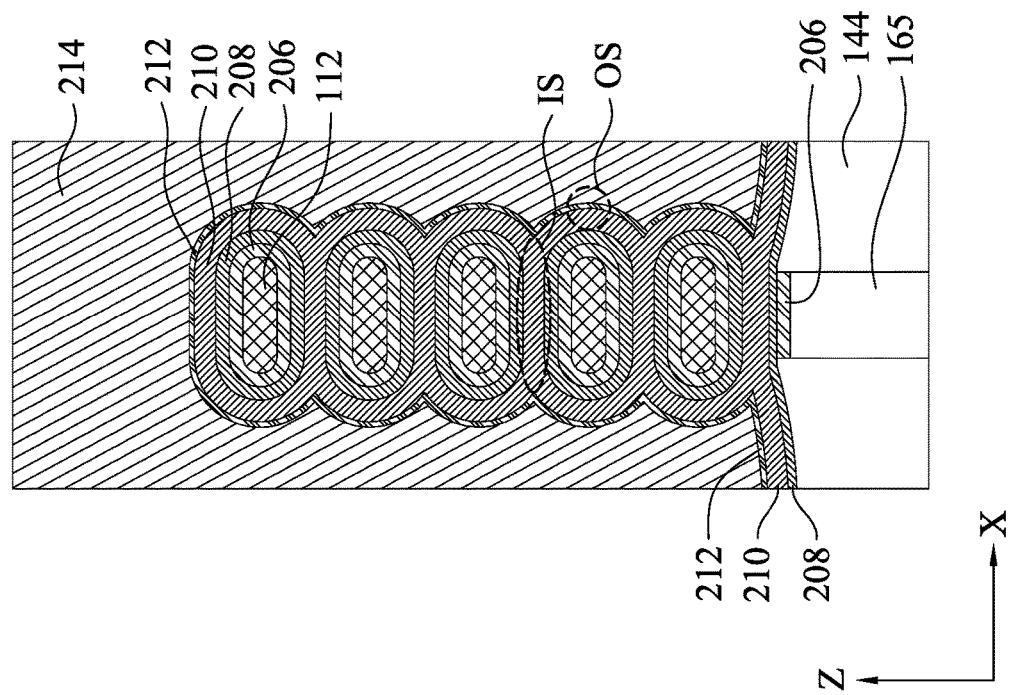
Figure 21A:
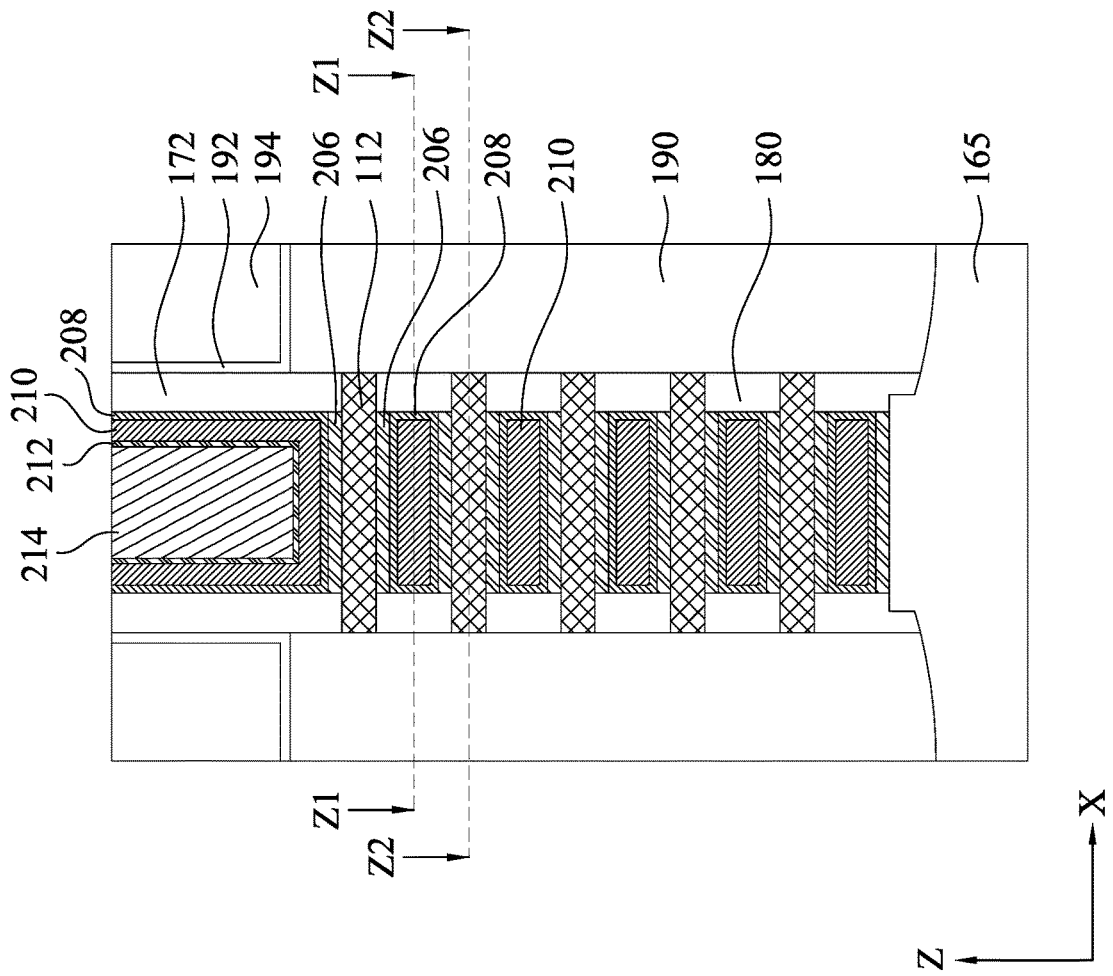
Figure 21D:
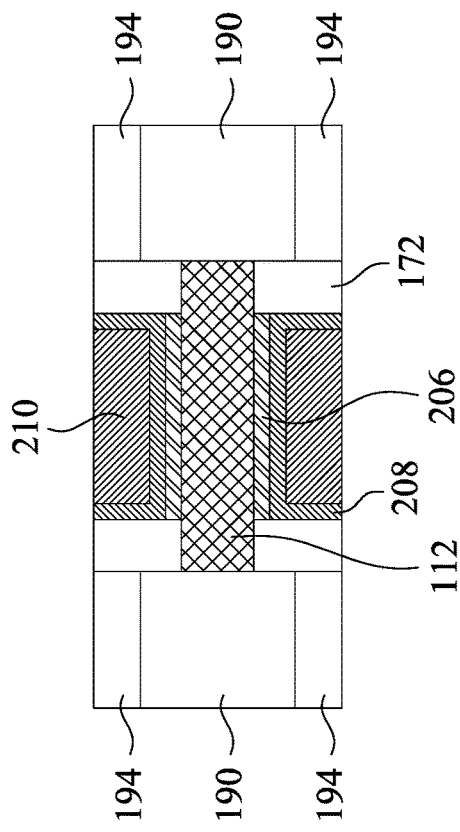
Figure 21C:
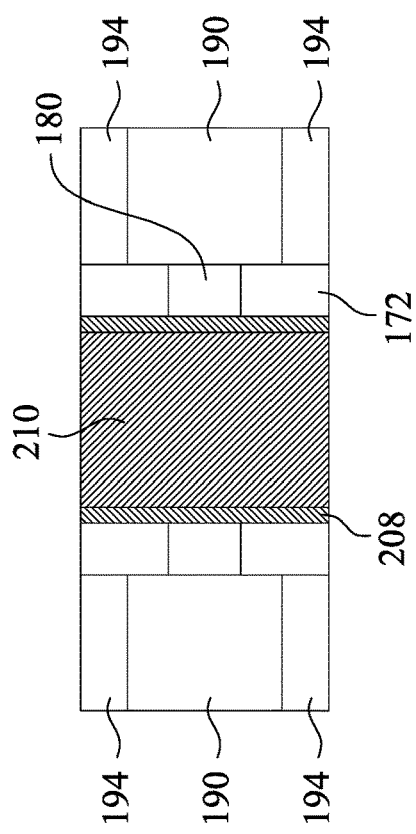

FIG. 21C is a cross sectional view corresponding to line Z1-Z1 of FIG. 21A. FIG. 21D is a cross sectional view corresponding to line Z2-Z2 of FIG. 21A. Referring to FIGS. 21A-21D, a fill metal layer 214 is formed within a trench on the glue layer 212 between the gate sidewall spacers 172. The fill metal layer 214 is deposited over the work function metal layer 210. The fill metal layer 214 may be a work function metal layer (i.e., formed of N-metal or P-metal discussed above). In some embodiments where the fill metal layer 214 is a work function metal layer, the fill metal layer 214 includes a fluorine-free metal, because the precursors used in deposition of the fill metal layer 214 is fluorine-free. Examples of the fluorine-free metal includes metal nitride (e.g., TiN, TaN) or fluorine-free tungsten (i.e., tungsten deposited without using fluorine-containing precursors). In some embodiments, the fill metal layer 214 includes titanium-based material such as TiN. In some embodiments, the fill metal layer 214 includes tantalum-based material such as TaN. That is, the fill metal layer 214 includes at least one of fluorine-free tungsten, titanium nitride and tantalum nitride. In an embodiment, after the interfacial layers 206, the high-k gate dielectric layer 132, the work function metal layer 210, the glue layer 212 and the fill metal layer 214 are deposited, a CMP process is performed to planarize a top surface of the semiconductor device 10. The fill metal layer 214 made of fluorine-free metal improves the threshold voltage of GAA devices and also increases a stability of the threshold voltage, as will be explained in greater detail below.

In some embodiments, the fill metal layer 214 may be formed by chemical vapor deposition (CVD) or atomic layer deposition (ALD). In some embodiments where the fill metal layer 214 is a tungsten layer, the fill metal layer 214 may be formed by sequentially introducing a chlorine-based precursor and a hydrogen gas, both of which are free of fluorine. The chlorine-based precursor is a fluorine-free precursor. Examples of the chlorine-based precursor include tungsten chlorine such as tungsten (V) chloride ($WCl_5$), the like, or a combination thereof. In some embodiments, the fluorine-free tungsten is deposited by using $WCl_5$ and $H_2$ as precursor, and is deposited at a temperature in a range from about 350° C. to about 500° C. at a chamber pressure in a range from about 0.5 torr to about 50 torr. In some embodiments where the fill metal layer 214 is formed by ALD, the fill metal layer 214 may be formed for a pulse time in a range from about 0.2 s to about 4 s. As compared to using a fluorine-based precursor (e.g., $WF_6$) to deposit the fill metal layer 214, during forming the fill metal layer 214, the chlorine-based precursor generates a plurality of chlorine atoms during deposition. Because the chlorine atoms have less tendency than fluorine atoms to diffuse into the underlying layers (e.g., the glue layer 212 and/or the work function metal layer 210), the chlorine atoms do not pass through the underlying layers (e.g., the glue layer 212 and/or the work function metal layer 210) and thus the threshold voltage of the resulting GAA transistor is less susceptible to the precursors used in the fill metal deposition. As a result, the threshold voltage can be improved and stable.

By contrast, if the fluorine-based precursor is used to form the fill metal layer 214, the fluorine-based precursor may generate fluorine atoms during forming the fill metal layer 214, which may aggressively diffuse into the underlying layers (e.g., the glue layer 212 and the work function metal layer 210) as compared to chlorine atoms as discussed above. Moreover, it is observed that diffusion of fluorine atoms usually stops or slows down at outer-sheet regions OS of work function metal layer 210, which in turn would lead to a fluorine-rich outer-sheet region OS and a fluorine-poor or fluorine-free inner-sheet region IS in the work function metal layer 210. In that case, the work function metal layer 210 would have a non-uniform and unpredictable fluorine concentration, which in turn leads to increased challenge on threshold voltage control, thus resulting in threshold voltage instability. Given that embodiments of the present disclosure do not use fluorine-based precursor in fill metal deposition, all possible challenges caused by the fluorine-based precursor can be prevented. In greater detail, both the inner-sheet region IS and the outer-sheet region OS in the work function metal layer 210 are free of fluorine, and the glue layer 212 is free of fluorine as well, so as to improve threshold voltage control.

In some embodiments where the fill metal layer 214 includes titanium nitride, the fill metal layer 214 may be formed using a metal inorganic precursor (e.g., TiCl$_4$) and NH$_3$ at a temperature in a range from about 300° C. to about 500° C., at a chamber pressure in a range from about 0.2 torr to about 50 torr. In some embodiments where the fill metal layer 214 is formed by ALD, the fill metal layer 214 may be formed for a pulse time in a range from about 0.2 s to about 4 s. The metal inorganic precursor is a fluorine-free precursor. Examples of the metal inorganic precursor include titanium chloride (TiCl$_4$). In some other embodiments, the fill metal layer 214 may be formed by a metal organic precursor and other gaseous precursors such as, NH$_3$ or N$_2$. The metal organic precursor is a fluorine-free precursor. Examples of the metal organic precursor include tetrakis (dimethylamino) titanium (TDMAT), tetrakis dimethyl-amino titanium (TDEAT) or tetrakis (ethylmethylamino) titanium (TEMAT). In some embodiments where the fill metal layer 214 includes TaN, the fill metal layer 214 may be deposited at a temperature in a range from about 250° C. to about 400° C., at a chamber pressure in a range from about 0.5 torr to about 50 torr. In some embodiments where the fill metal layer 214 is formed by ALD, the fill metal layer 214 may be formed for a duration in a range from about 0.2 s to about 4 s.

Figure 22B:
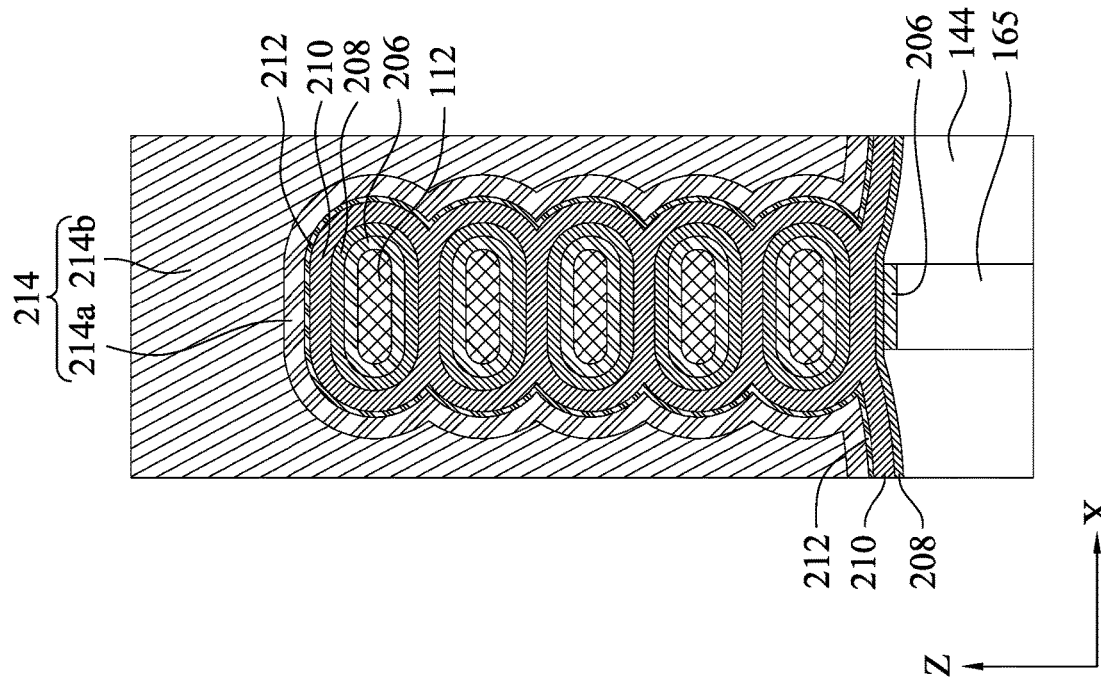
Figure 22A:
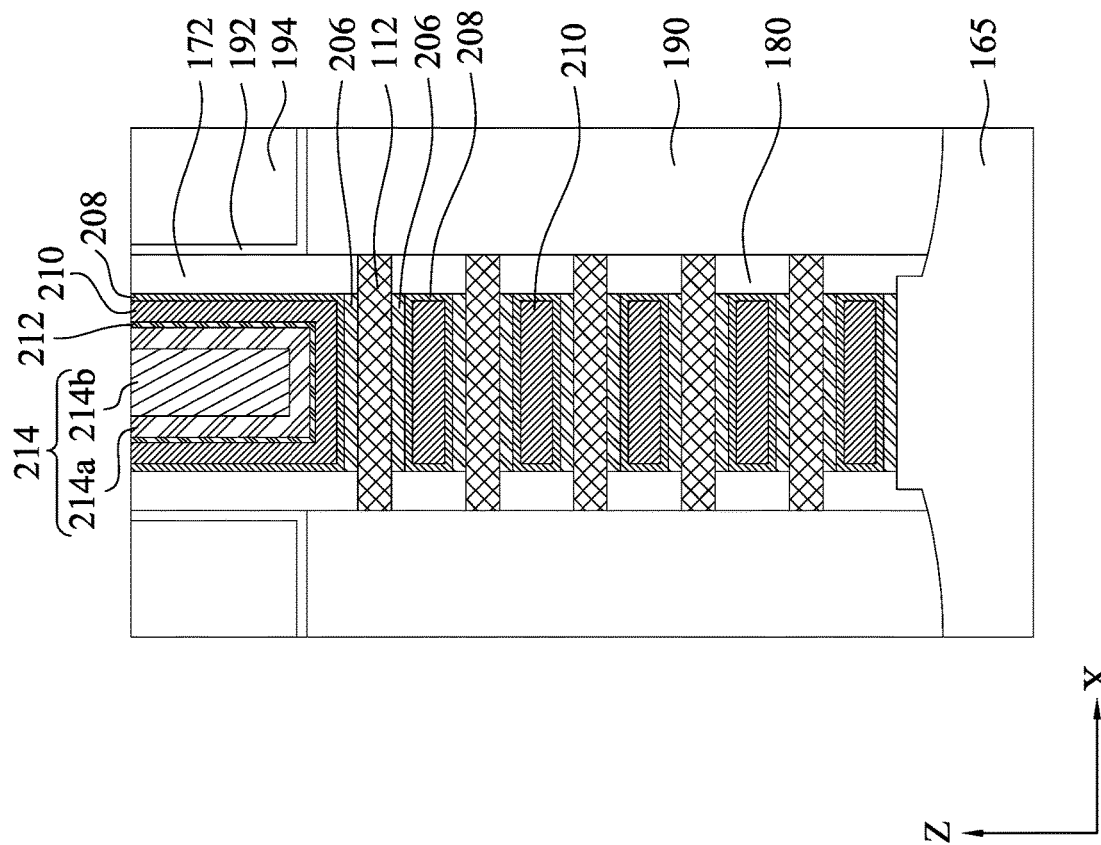

FIGS. 22A and 22B show another device similar to the device in FIGS. 21A and 21B, except for the fill metal layer 214 including a first fluorine-free metal layer 214a and a second fluorine-free metal layer 214b. The first fluorine-free metal layer 214a is formed on and surrounds the glue layer 212. The first fluorine-free metal layer 214a is a conformal layer and is conformally formed over the glue layer 212. In some embodiments, the first fluorine-free metal layer 214a includes TiN, TaN or tungsten and is formed by CVD or ALD without using any fluorine-containing precursors. In some embodiments where the first fluorine-free metal layer 214a includes TiN, the glue layer 212 and the first fluorine-free metal layer 214a may have no distinguishable interface therebetween. The second fluorine-free metal layer 214b includes a material different from a material of the first layer 214a. In some embodiments where the first fluorine-free metal layer 214a includes TaN, the second fluorine-free metal layer 214b includes TiN or tungsten. In some embodiments where the first fluorine-free metal layer 214a includes TiN, the second fluorine-free metal layer 214b includes TaN or tungsten. In some embodiments where the first fluorine-free metal layer 214a includes tungsten, the second fluorine-free metal layer 214b includes TiN or TiN.

The second fluorine-free metal layer 214b is formed within a trench in the first fluorine-free metal layer 214a between the gate sidewall spacers 172. The second fluorine-free metal layer 214b is deposited over the first fluorine-free metal layer 214a. The first fluorine-free metal layer 214a and the second fluorine-free metal layer 214b are beneficial for improving the threshold voltage and increasing a stability of the threshold voltage.

Figure 23B:
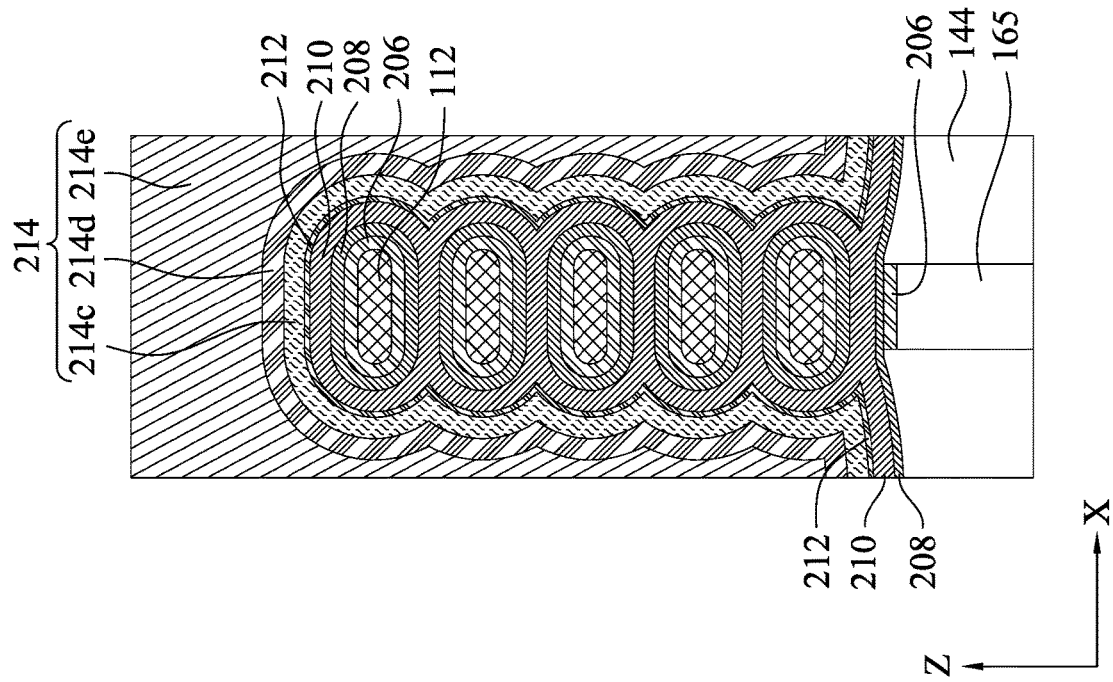
Figure 23A:
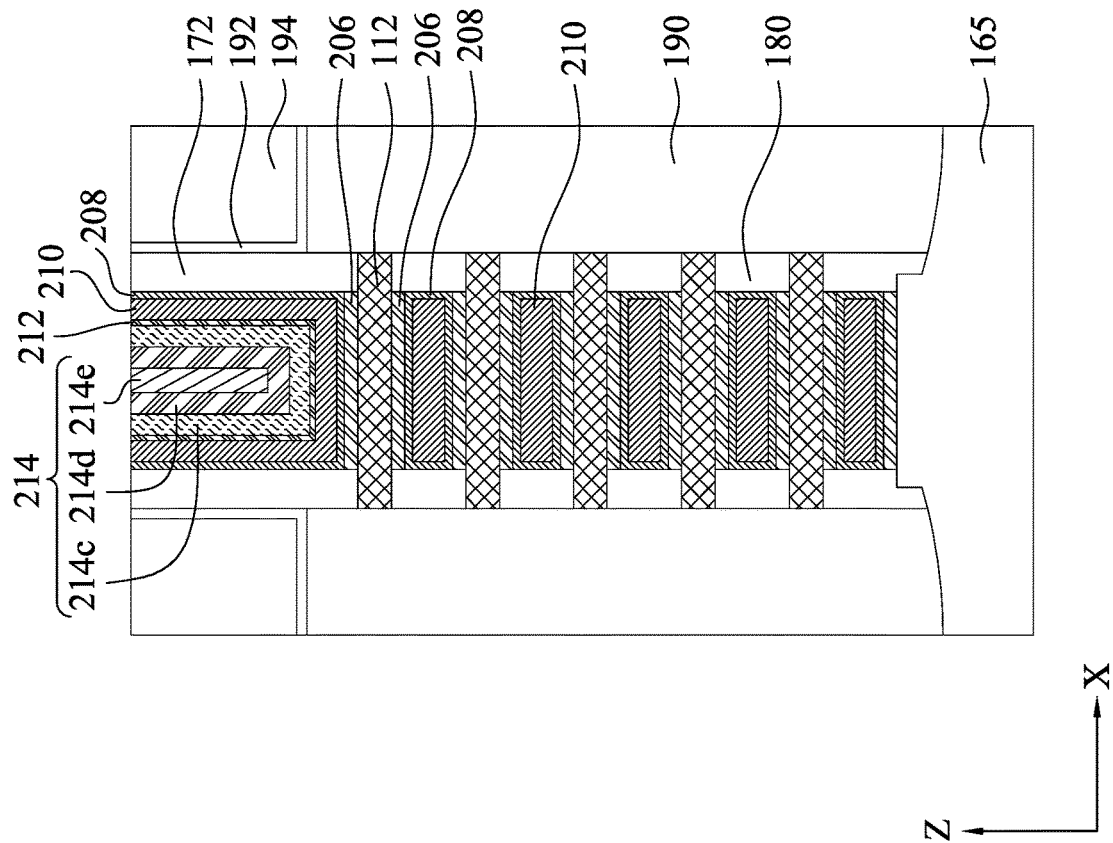

FIGS. 23A and 23B show another device similar to the device in FIGS. 21A and 21B, except for the fill metal layer 214 including a first fluorine-free metal layer 214c, a second fluorine-free metal layer 214d and a third fluorine-free metal layer 214e. The first fluorine-free metal layer 214c is formed on and surrounds the glue layer 212. The first fluorine-free metal layer 214c is a conformal layer and is conformally formed over the glue layer 212. The second fluorine-free metal layer 214d is formed on and surrounds the first fluorine-free metal layer 214c. The second fluorine-free metal layer 214d is a conformal layer and is conformally formed over the first fluorine-free metal layer 214c.

In some embodiments, the first fluorine-free metal layer 214c includes TiN, TaN or tungsten and is formed by CVD or ALD without using any fluorine-containing precursors. In some embodiments where the first fluorine-free metal layer 214c includes TiN, the glue layer 212 and the first fluorine-free metal layer 214c may have no distinguishable interface therebetween. The second fluorine-free metal layer 214d includes a material different from a material of the first fluorine-free metal layer 214c. In some embodiments where the first fluorine-free metal layer 214c includes TaN, the second fluorine-free metal layer 214d includes TiN or tungsten. In some embodiments where the first fluorine-free metal layer 214c includes TiN, the second fluorine-free metal layer 214d includes TaN or tungsten. In some embodiments where the first fluorine-free metal layer 214c includes tungsten, the second fluorine-free metal layer 214d includes TiN or TiN.

The third fluorine-free metal layer 214e is formed within a trench in the second fluorine-free metal layer 214d between the gate sidewall spacers 172. The third fluorine-free metal layer 214e is deposited over the second fluorine-free metal layer 214d. The third fluorine-free metal layer 214e is beneficial for improving the threshold voltage and increasing a stability of the threshold voltage.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that the fill metal layer may be free from fluorine because it is deposited without using any fluorine-containing precursors. Another advantage is that the work function metal layer may be free from fluorine as well. Still another advantage is that the fluorine-free work function metal layer allows for improved threshold voltage control.

In some embodiments, a method of forming a semiconductor device including forming a fin structure having a stack of alternating first semiconductor layers and second semiconductor layers over a substrate, the first semiconductor layers and the second semiconductor layers having different compositions, forming a dummy gate structure across the fin structure, forming gate spacers on opposite sidewalls of the dummy gate structure, respectively, removing the dummy gate structure to form a gate trench between the gate spacers, etching the first semiconductor layers in the gate trench, such that the second semiconductor layers are suspended in the gate trench to serve as nanosheets, forming a work function metal layer surrounding each of the nanosheets, and depositing a fill metal layer over the work function metal layer without using a fluorine-containing precursor.

In some embodiments, the fill metal layer is deposited using a chlorine-based precursor and a hydrogen gas. In some embodiments, the chlorine-based precursor includes tungsten chloride. In some embodiments, during forming the fill metal layer, the chlorine-based precursor generates a plurality of chlorine atoms which do not pass through the work function metal layer. In some embodiments, the fill metal layer includes fluorine-free tungsten. In some embodiments, after forming the fill metal layer, the fill metal layer is free from fluorine. In some embodiments, after forming the fill metal layer, the work function metal layer is free from fluorine. In some embodiments, the method further includes after forming the work function metal layer and before depositing the fill metal layer, forming a glue layer surrounding the work function metal layer, wherein the fill metal layer has a material different from a material of the glue layer. In some embodiments, after forming the fill metal layer, the glue layer is free from fluorine.

In some embodiments, a method of forming a semiconductor device includes forming a fin structure having a stack of alternating first semiconductor layers and second semiconductor layers over a substrate, forming a dummy gate structure across the fin structure, forming gate spacers on opposite sidewalls of the dummy gate structure, respectively, removing the dummy gate structure to form a gate trench between the gate spacers, etching the first semiconductor layers in the gate trench, such that the second semiconductor layers are suspended in the gate trench to serve as nanosheets, and forming a metal gate structure filling up the gate trench. Formation of the metal gate structure includes forming a first work function metal layer surrounding each of the nanosheets, forming a glue layer surrounding the first work function metal layer, and forming a second work function metal layer over the glue layer such that the second work function metal layer fills the gate trench between the gate spacers, wherein the second work function metal layer is an outermost layer of the metal gate structure, and the second work function metal layer is fluorine-free.

In some embodiments, the first and second work function metal layers include a same fluorine-free metal. In some embodiments, the second work function metal layer and the first work function metal layer are fluorine-free metal nitride layers. In some embodiments, the second work function metal layer and the first work function metal layer include a titanium-based material. In some embodiments, the second work function metal layer and the first work function metal layer include fluorine-free titanium nitride. In some embodiments, the second work function metal layer includes tantalum-based material. In some embodiments, the second work function metal layer is fluorine-free a tantalum nitride layer. In some embodiments, the second work function metal layer is formed by a deposition process without using any fluorine-containing precursors. In some embodiments, the second work function metal layer is formed by a deposition process using a chlorine-containing precursor.

In some embodiments, a semiconductor device includes a plurality of nanosheets and a gate structure. The plurality of nanosheets extends in a first direction above a semiconductor substrate and arranged in a second direction substantially perpendicular to the first direction. The gate structure extends in a third direction perpendicular to both the first and second directions. The gate structure surrounds each of the plurality of nanosheets. The gate structure includes a plurality of high-k gate dielectric layers, a work function layer and a fluorine-free fill metal layer. The plurality of high-k gate dielectric layers respectively surrounds the plurality of nanosheets. The work function layer surrounds each of the plurality of high-k gate dielectric layers. The fluorine-free fill metal layer surrounds the work function metal layer.

In some embodiments, the work function layer is also fluorine-free.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a plurality of semiconductor layers over the substrate;
   a first fill metal layer around the plurality of semiconductor layers;
   a second fill metal layer over the first fill metal layer;
   a third fill metal layer over the second fill metal layer, wherein the first fill metal layer, the second fill metal layer and the third fill metal layer are selected from a group consisting of fluorine-free TiN, fluorine-free TaN and fluorine-free W;
   a work function metal layer between the plurality of semiconductor layers and the first fill metal layer; and
   a glue layer between the work function metal layer and the first fill metal layer, wherein the first fill metal layer, the second fill metal layer, the third fill metal layer and the glue layer do not fully surround the plurality of semiconductor layers.

2. The semiconductor device of claim 1, wherein the first fill metal layer is a conformal layer.

3. The semiconductor device of claim 1, wherein the second fill metal layer is a conformal layer.

4. The semiconductor device of claim 1, wherein the first fill metal layer includes a composition different than a composition of the second fill metal layer and a composition of the third fill metal layer.

5. The semiconductor device of claim 1, wherein the second fill metal layer includes a composition different than a composition of the first fill metal layer and a composition of the third fill metal layer.

6. The semiconductor device of claim 1, wherein the third fill metal layer includes a composition different than a composition of the first fill metal layer and a composition of the second fill metal layer.

7. The semiconductor device of claim 1, wherein at least one of the first fill metal layer, the second fill metal layer and the third fill metal layer is formed without using any fluorine-containing precursors.

8. A semiconductor device, comprising:
a plurality of channel layers arranged one above another;
a gate structure wrapping around the plurality of channel layers; and
gate spacers over the plurality of channel layers, wherein the gate structure has a first region between adjacent two of the plurality of channel layers and a second region over the plurality of channel layers, the second region of the gate structure comprises a multilayer structure formed by fluorine-free TaN, fluorine-free TiN or fluorine-free W, and the first region of the gate structure is free from the multilayer structure, and
wherein the second region of the gate structure further comprises a work function metal layer between the plurality of channel layers and the multilayer structure, and the second region of the gate structure further comprises a glue layer between the work function metal layer and the multilayer structure, the second region of the gate structure and the glue layer do not fully surround the plurality of channel layers.

9. The semiconductor device of claim 8, wherein the first region of the gate structure is a single-layer film made of a work function material.

10. The semiconductor device of claim 9, wherein the single-layer film is fluorine-free.

11. The semiconductor device of claim 8, wherein the first region of the gate structure is a stack of one or more N-metal layers and one or more P-metal layers.

12. The semiconductor device of claim 11, wherein the stack of one or more N-metal layers and one or more P-metal layers is fluorine-free.

13. The semiconductor device of claim 8, wherein the first region of the gate structure includes tungsten or tungsten nitride.

14. The semiconductor device of claim 8, wherein the multilayer structure of the second region of the gate structure is a double-layer.

15. The semiconductor device of claim 8, further comprising:
a gate dielectric layer surrounding the plurality of channel layers, wherein the first region of the gate structure is thicker than the gate dielectric layer.

16. The semiconductor device of claim 15, further comprising:
a silicon oxide layer between the gate dielectric layer and adjacent two of the plurality of channel layers, wherein the first region of the gate structure is thicker than the silicon oxide layer.

17. A semiconductor device, comprising:
a semiconductor substrate;
a plurality of semiconductor nanostructures over the semiconductor substrate;
epitaxial source/drain regions on opposite sides of the plurality of semiconductor nanostructures;
a high-k gate dielectric layer wrapping around the plurality of semiconductor nanostructures;
a metal gate stack over the high-k gate dielectric layer, wherein the metal gate stack includes a fluorine-free nitride-containing region extending around the plurality of semiconductor nanostructures and terminating prior to reaching a region between adjacent two of the plurality of semiconductor nanostructures;
a work function metal layer between the high-k gate dielectric layer and the fluorine-free nitride-containing region of the metal gate stack, and the work function metal layer is free from fluorine; and
a glue layer between the high-k gate dielectric layer and the fluorine-free nitride-containing region of the metal gate stack, wherein the fluorine-free nitride-containing region of the metal gate stack and the glue layer do not fully surround the semiconductor nanostructures.

18. The semiconductor device of claim 17, further comprising:
a shallow trench isolation (STI) region interposing between the semiconductor substrate and the plurality of semiconductor nanostructures, wherein the fluorine-free nitride-containing region of the metal gate stack extends along a top surface of the STI region.

19. The semiconductor device of claim 17,
wherein the glue layer is free of fluorine.

20. The semiconductor device of claim 19, wherein the glue layer is a fluorine-free TiN layer.

* * * * *